US009452397B2

(12) United States Patent
Komiya et al.

(10) Patent No.: US 9,452,397 B2
(45) Date of Patent: Sep. 27, 2016

(54) LIQUID PROCESSING APPARATUS, LIQUID PROCESSING METHOD, AND STORAGE MEDIUM THAT STORES COMPUTER PROGRAM FOR IMPLEMENTING LIQUID PROCESSING METHOD

(71) Applicant: Tokyo Electron Limited, Tokyo (JP)

(72) Inventors: Hiroshi Komiya, Koshi (JP); Kazuyoshi Eshima, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 815 days.

(21) Appl. No.: 13/772,550

(22) Filed: Feb. 21, 2013

(65) Prior Publication Data

US 2013/0223180 A1      Aug. 29, 2013

(30) Foreign Application Priority Data

Feb. 24, 2012   (JP) ................................. 2012-039038

(51) Int. Cl.
| | |
|---|---|
| *B01F 15/02* | (2006.01) |
| *B01F 5/10* | (2006.01) |
| *B01F 15/04* | (2006.01) |
| *B01F 3/08* | (2006.01) |
| *H01L 21/67* | (2006.01) |

(52) U.S. Cl.
CPC ............... *B01F 15/02* (2013.01); *B01F 3/088* (2013.01); *B01F 5/10* (2013.01); *B01F 15/0479* (2013.01); *H01L 21/6715* (2013.01); *B01F 2003/0896* (2013.01); *B01F 2215/0096* (2013.01)

(58) Field of Classification Search
CPC ....................................................... B01F 15/02
See application file for complete search history.

(56) References Cited

U.S. PATENT DOCUMENTS

| | | | | |
|---|---|---|---|---|
| 3,873,362 | A * | 3/1975 | Mihram ................. | G21F 9/004 134/13 |
| 4,014,735 | A * | 3/1977 | Guth ........................ | B01D 1/00 159/13.2 |
| 4,899,767 | A * | 2/1990 | McConnell ............. | B05C 3/109 134/102.2 |
| 5,845,660 | A * | 12/1998 | Shindo ............. | H01L 21/67028 134/102.3 |
| 6,050,283 | A * | 4/2000 | Hoffman .............. | G05D 11/135 137/3 |
| 7,784,998 | B2 * | 8/2010 | Jang ..................... | B01F 13/1055 366/150.1 |
| 2001/0047821 | A1 * | 12/2001 | Noji ..................... | G05D 11/131 137/87.02 |
| 2004/0221880 | A1 * | 11/2004 | Tomita ..................... | B08B 3/10 134/95.1 |

(Continued)

FOREIGN PATENT DOCUMENTS

| | | | |
|---|---|---|---|
| CN | 101591010 A | * | 12/2009 |
| JP | 3028578 U | | 6/1996 |

(Continued)

*Primary Examiner* — David Sorkin
*Assistant Examiner* — Abbas Rashid
(74) *Attorney, Agent, or Firm* — Pearne & Gordon LLP

(57) ABSTRACT

A liquid processing apparatus 200 includes a pure water supply source 20; a pure water flow rate control opening/closing valve 27; a sulfuric acid supply unit 30; a sulfuric acid supply opening/closing valve 34; mixing tanks 11 and 12 configured to mix pure water and sulfuric acid to produce a mixed chemical liquid and connected to a circulation line 100 having a circulation pump 101; a liquid processing unit 210 configured to perform a liquid process on a substrate W with the mixed chemical liquid. A controller 300 controls a pure water supply opening/closing valve 26, the sulfuric acid supply opening/closing valve 34, and the circulation pump 101, such that operation of the circulation pump 101 is started after starting supply of the pure water to the mixing tanks 11 and 12, and then, supply of sulfuric acid to the mixing tanks 11 and 12 is started.

8 Claims, 8 Drawing Sheets

(56) References Cited

U.S. PATENT DOCUMENTS

| | | | |
|---|---|---|---|
| 2006/0219273 A1* | 10/2006 | Nagara | H01L 21/67057 134/56 R |
| 2007/0034231 A1* | 2/2007 | Takahashi | H01L 21/67253 134/3 |
| 2010/0243003 A1* | 9/2010 | Ogawa | B08B 3/12 134/34 |
| 2012/0240426 A1* | 9/2012 | Hayashi | H01L 21/02068 34/351 |
| 2013/0092553 A1* | 4/2013 | Yamakawa | C25B 1/28 205/471 |

FOREIGN PATENT DOCUMENTS

| | | |
|---|---|---|
| JP | 2000-223455 A | 8/2000 |
| JP | 2001-118821 A | 4/2001 |
| JP | 2002-343762 A | 11/2002 |
| JP | 2006-080431 A | 3/2006 |
| JP | 2006-255696 A | 9/2006 |

* cited by examiner

LIQUID PROCESSING APPARATUS, LIQUID
PROCESSING METHOD, AND STORAGE
MEDIUM THAT STORES COMPUTER
PROGRAM FOR IMPLEMENTING LIQUID
PROCESSING METHOD

CROSS-REFERENCE TO RELATED
APPLICATION

This application claims the benefit of Japanese Patent Application No. 2012-039038 filed on Feb. 24, 2012, the entire disclosures of which are incorporated herein by reference.

FIELD OF THE INVENTION

The present disclosure relates to a liquid processing apparatus that performs a liquid process on a substrate with a chemical liquid, a liquid processing method, and a storage medium that stores a computer program for implementing the liquid processing method.

BACKGROUND OF THE INVENTION

In a semiconductor device manufacturing process or a flat panel display (FPD) manufacturing process, there is performed an etching process of etching an oxide film of a semiconductor wafer serving as a processing target substrate. During the etching process, a part of resist is corroded with an etching liquid to be modified, and a polymer (resist residue) is formed to remain on the semiconductor wafer. Therefore, after the etching process, a cleaning process is performed on the wafer with a chemical liquid to remove the polymer remaining on the semiconductor wafer. By way of example, a mixed chemical liquid containing sulfuric acid, hydrogen peroxide solution, hydrofluoric acid, and the like is used as the chemical liquid.

Patent Document 1: Japanese Patent Laid-open Publication No. 2002-343762

Generally, when sulfuric acid is mixed with water, an exothermic reaction occurs. Therefore, if pure water is mixed with sulfuric acid, a temperature of the mixed solution is increased. Meanwhile, it is appropriate for a mixed chemical liquid including pure water, sulfuric acid, hydrogen peroxide solution, and hydrofluoric acid to be used around room temperature.

In a cleaning apparatus described in Patent Document 1, pure water, hydrogen peroxide solution, and sulfuric acid are supplied into a pre-mixing tank and then a mixing pump is operated. Thus, the sulfuric acid is concentrated on a certain portion of an inside of the pre-mixing tank and a temperature of the mixed chemical liquid within the pre-mixing tank tends to highly increase at this portion. In this case, it takes a lot of time to cool the mixed chemical liquid having an increased temperature, and, thus, it is difficult to shorten a time for producing the mixed chemical liquid.

BRIEF SUMMARY OF THE INVENTION

In view of the foregoing, an illustrative embodiment provides a liquid processing apparatus capable of shortening a time for producing a mixed chemical liquid that contains pure water and sulfuric acid and that is used for performing a process on a substrate, a liquid processing method, and a storage medium that stores a computer program for implementing the liquid processing method.

In accordance with one aspect of the illustrative embodiment, there is provided a liquid processing apparatus. The liquid processing apparatus includes a mixing tank configured to mix pure water and sulfuric acid to produce a mixed chemical liquid; a pure water supply line configured to connect a pure water supply unit with the mixing tank; a sulfuric acid supply line configured to connect a sulfuric acid supply unit with the mixing tank; a liquid processing unit that is connected to the mixing tank and configured to perform a liquid process on a substrate with the mixed chemical liquid produced in the mixing tank; a pure water supply opening/closing valve provided at the pure water supply line; a sulfuric acid supply opening/closing valve provided at the sulfuric acid supply line; a circulation line having a circulation pump configured to return the mixed chemical liquid discharged from the mixing tank back to the mixing tank, both ends of the circulation line being connected to the mixing tank; and a controller configured to control the pure water supply opening/closing valve, the sulfuric acid supply opening/closing valve, and the circulation pump. Further, the controller is configured to perform a process of starting supply of the pure water to the mixing tank, a process of starting operation of the circulation pump after the process of starting supply of the pure water to the mixing tank, and a process of starting supply of sulfuric acid to the mixing tank from the sulfuric acid supply line after the process of starting operation of the circulation pump.

Further, in accordance with another aspect of the illustrative embodiment, there is provided a liquid processing method performed in a liquid processing apparatus. The liquid processing apparatus includes a mixing tank that mixes pure water and sulfuric acid to produce a mixed chemical liquid; a pure water supply line connected to the mixing tank; a sulfuric acid supply line connected to the mixing tank; a liquid processing unit that is connected to the mixing tank and configured to perform a liquid process on a substrate with the mixed chemical liquid produced in the mixing tank; a circulation line having a circulation pump that returns the mixed chemical liquid discharged from the mixing tank back to the mixing tank, both ends of the circulation line being connected to the mixing tank. Here, the liquid processing method includes producing the mixed chemical liquid by mixing pure water and sulfuric acid in the mixing tank; and performing a liquid process on a substrate with the mixed chemical liquid in the liquid processing unit. Further, the producing of the mixed chemical liquid comprises starting supply of the pure water to the mixing tank; starting operation of the circulation pump after starting the supply of the pure water to the mixing tank; starting supply of the sulfuric acid to the mixing tank after starting the operation of the circulation pump, and supplying the mixed chemical liquid produced in the mixing tank to the substrate.

Furthermore, in accordance with still another aspect of the illustrative embodiment, there is provided a storage medium having stored thereon computer-executable instructions that, in response to execution, cause the liquid processing apparatus to perform the liquid processing method.

In accordance with the illustrative embodiment, it is possible to shorten a time for producing a mixed chemical liquid that contains pure water and sulfuric acid and that is used for performing a process on a substrate.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which.

DETAILED DESCRIPTION OF THE INVENTION

Hereinafter, a liquid processing apparatus, a liquid processing method, and a storage medium that stores a computer program for implementing the liquid processing method in accordance with illustrative embodiments of the present disclosure will be explained with reference to the accompanying drawings. In the accompanying drawings, a contraction scale, a dimension ratio between a horizontal direction and a vertical direction, and the like are suitably modified and exaggerated from real ones, for the sake of illustration and understanding.

Above all, there will be explained a liquid processing apparatus in accordance with an illustrative embodiment with reference to FIG. 1.

Figure 1:
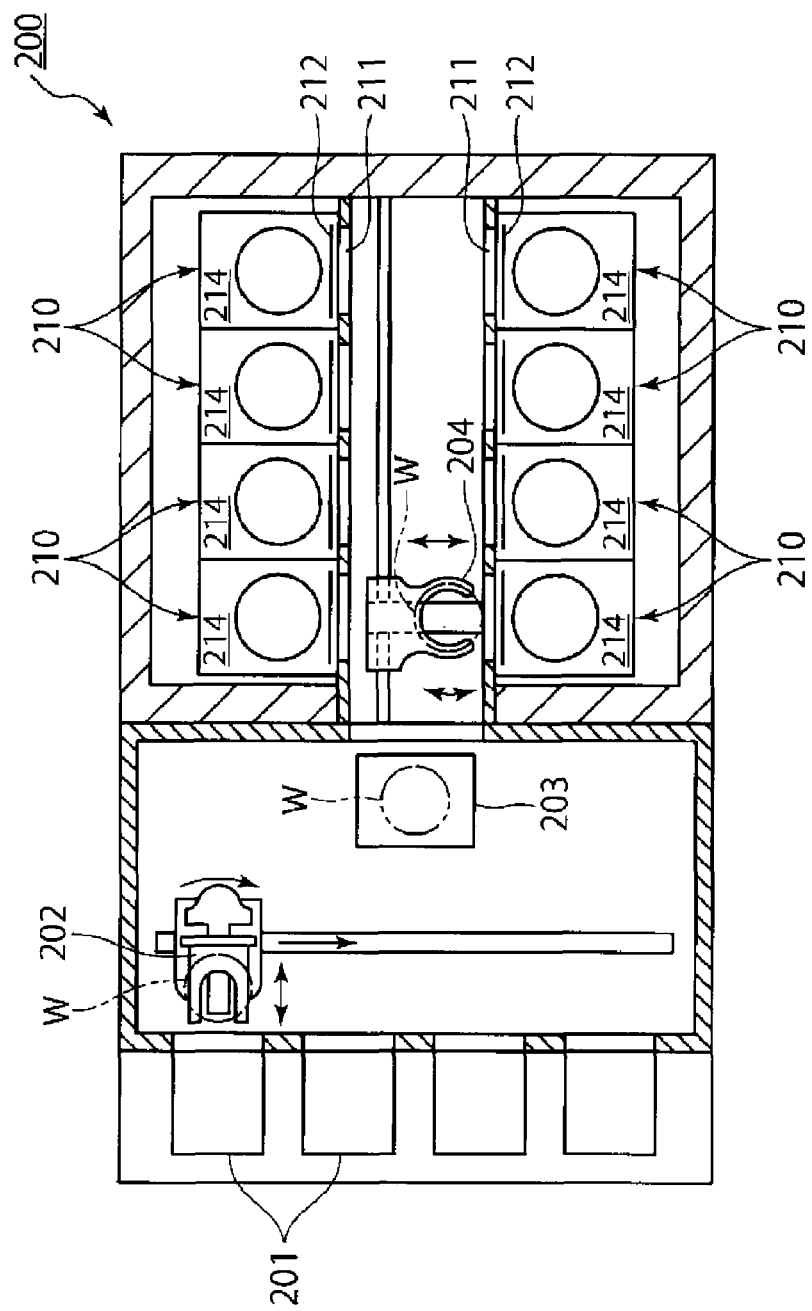
FIG. 1 is a top view of a liquid processing apparatus in accordance with an illustrative embodiment of the present disclosure.

As depicted in FIG. 1, a liquid processing apparatus 200 includes a mounting table 201 configured to mount thereon a carrier that accommodates therein a substrate (hereinafter, referred to as "wafer W") such as a semiconductor wafer serving as a processing target substrate from outside, a transfer arm 202 configured to take out the wafer W accommodated in the carrier, a rack unit 203 configured to mount thereon the wafer W taken out by the transfer arm 202, and a transfer arm 204 configured to receive the wafer W mounted on the rack unit 203 and transfer the wafer W into a liquid processing unit 210. As depicted in FIG. 1, the liquid processing apparatus 200 includes multiple (eight in FIG. 1) liquid processing units 210.

An opening 211 for loading the wafer W into a liquid processing chamber 214 (see FIG. 2) or unloading the wafer W from the liquid processing chamber 214 by the transfer arm 204 is formed at a side wall of each liquid processing unit 210. A shutter 212 for opening and closing the opening 211 is provided at the opening 211.

Figure 2:
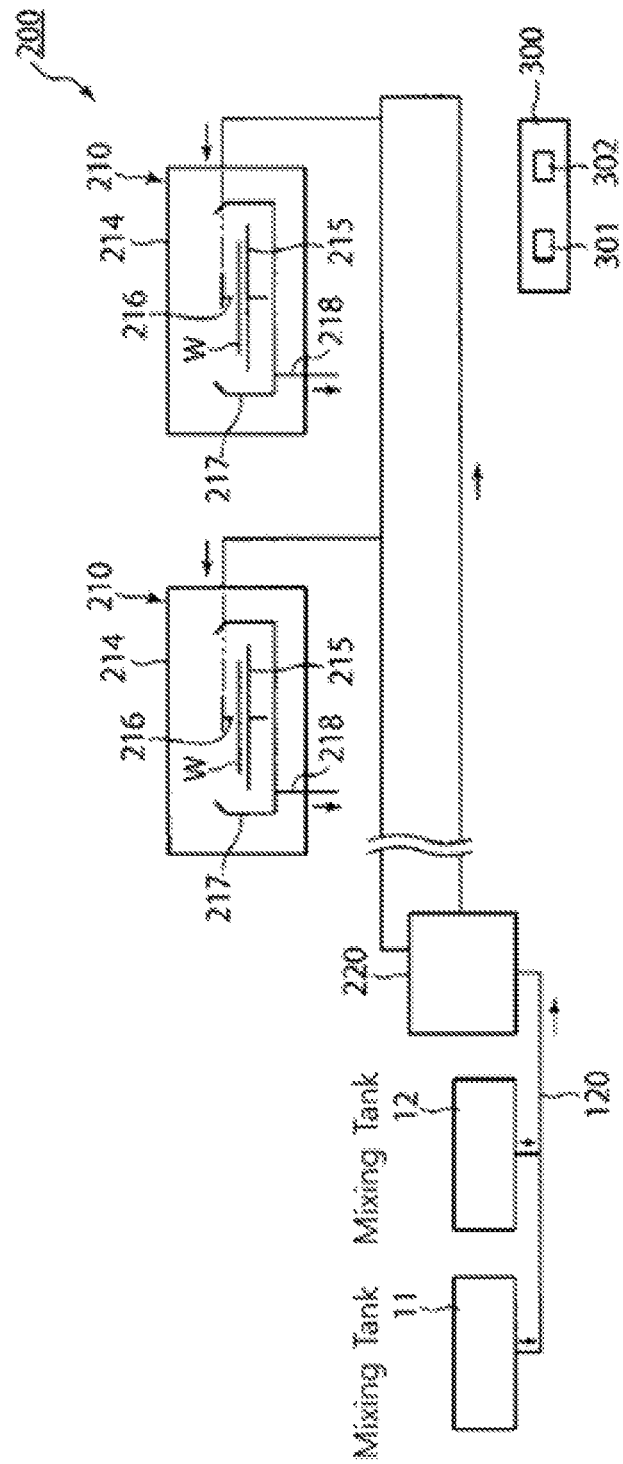
FIG. 2 is a diagram illustrating a schematic configuration of the liquid processing apparatus of FIG. 1.

As depicted in FIG. 2, the liquid processing apparatus 200 includes two mixing tanks 11 and 12 (a first mixing tank 11 and a second mixing tank 12), the multiple liquid processing units 210, and a controller 300. In the two mixing tanks 11 and 12, pure water (DIW), sulfuric acid ($H_2SO_4$), hydrogen peroxide solution ($H_2O_2$), and hydrofluoric acid (HF) are mixed to produce a mixed chemical liquid (hereinafter, simply referred to as "chemical liquid") having a certain concentration for processing the wafer W. Further, in the liquid processing unit 210, a liquid process is performed on the wafer W with a processing liquid including the chemical liquid produced in the mixing tanks 11 and 12. Furthermore, the controller 300 controls an overall operation of the liquid processing apparatus 200. A chemical liquid storage tank 220 is provided between the each of the mixing tanks 11 and 12 and each of the liquid processing units 210. The chemical liquid storage tank 220 is configured to store the chemical liquid produced in the mixing tanks 11 and 12 and supply the chemical liquid to the liquid processing unit 210. The chemical liquid storage tank 220 can store a chemical liquid in an amount required for a liquid process to be performed on a certain number of the wafers W in the liquid processing unit 210. By way of example, the mixing tanks 11 and 12 are switchably used to efficiently perform a liquid process on the wafer W in the liquid processing unit 210.

The liquid processing unit 210 includes a liquid processing chamber 214, a substrate holder 215, and a nozzle 216. The liquid processing chamber 214 is configured to accommodate the wafer W and a liquid process is performed on the wafer W accommodated therein. The substrate holder 215 is provided within the liquid processing chamber 214 and configured to horizontally hold and rotate the wafer W and a nozzle 216 is provided above the wafer W held on the substrate holder 215 and configured to selectively discharge a chemical liquid and a rinse liquid to the wafer W. The nozzle 216 is connected to the chemical liquid storage tank 220 and a chemical liquid within the chemical liquid storage tank 220 is discharged to the wafer W through the nozzle 216.

Further, a ring-shaped cup 217 is provided around the circumference of the wafer W held on the substrate holder 215. A drain 218 is provided under the cup 217. With this configuration, a processing liquid dispersed from the wafer W to its side direction is guided by the cup 217 to be collected in the drain 218. The drain 218 is connected to a drain line (not illustrated) in a factory where the liquid processing apparatus 200 is installed. The chemical liquid collected by the drain 218 is discharged through the drain line.

Hereinafter, there will be explained a line arrangement system for each liquid in the liquid processing apparatus 200 in accordance with an illustrative embodiment with reference to FIG. 3. First of all, a system for pure water will be explained.

Figure 3:
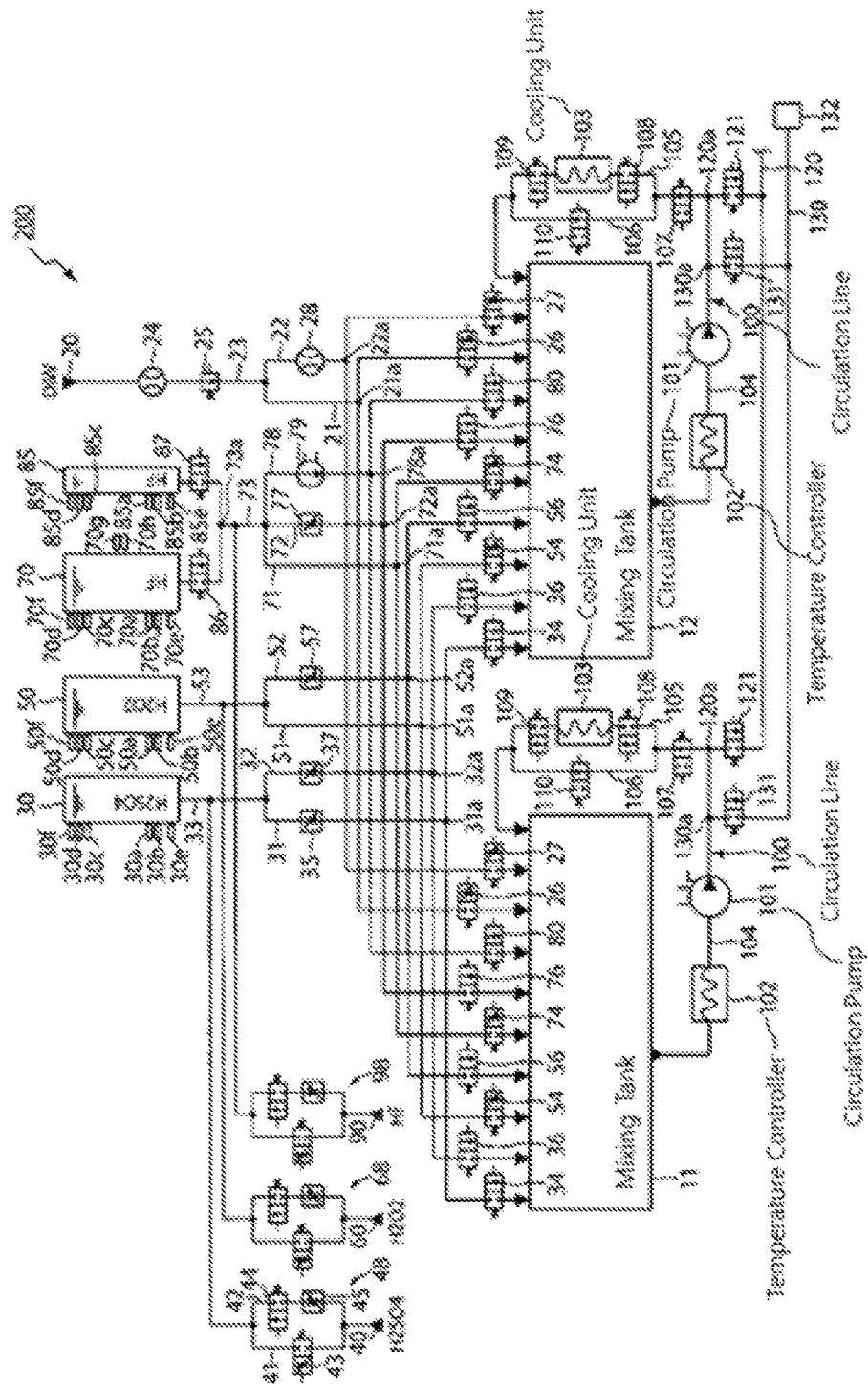
FIG. 3 is a diagram illustrating a line arrangement system for each liquid in the liquid processing apparatus of FIG. 2.

As depicted in FIG. 3, each of the mixing tanks 11 and 12 is connected to a pure water supply source 20 (pure water supply unit) that supplies pure water to the mixing tanks 11 and 12 under pressurization. The pure water supply source 20 is connected to each of the mixing tanks 11 and 12 through a first pure water supply line 21 and a second pure water supply line 22 parallel to each other. A flow rate of pure water (flowing through the second pure water supply line 22) at the second pure water supply line 22 (low flow rate pure water supply line) is lower than a flow rate of pure water at the first pure water supply line 21 (high flow rate pure water supply line). That is, the first pure water supply line 21 supplies pure water at a first pure water supply flow rate and the second pure water supply line 22 supplies pure water at a second pure water supply flow rate lower than the first pure water supply flow rate.

An upstream end portion (end portion at a side of the pure water supply source 20) of the first pure water supply line 21 and an upstream end portion of the second pure water supply line 22 are connected to the pure water supply source via a main pure water supply line 23. The main pure water supply line 23 includes a first pure water flow rate measurement device 24 and a pressure control valve 25. The first pure water flow rate measurement device 24 is configured to measure a flow rate of pure water flowing through the main pure water supply line 23. By adding up the flow rates of the pure water measured by the first pure water flow rate measurement device 24, it is possible to obtain a supply amount of pure water to be supplied to the each of the mixing tanks 11 and 12 from the pure water supply source 20. The pressure control valve 25 is configured to control a pressure of pure water flowing through the main pure water supply line 23.

A downstream end portion of the first pure water supply line 21 is connected to the mixing tanks 11 and 12. That is, the first pure water supply line 21 is branched on its way and connected to each of the first mixing tank 11 and the second mixing tank 12. Further, the first pure water supply line 21 includes first pure water flow rate control opening/closing valves 26 (pure water flow rate control valves). To be specific, the first pure water flow rate control opening/closing valves 26 are provided at a downstream side of a branch portion 21a of the first pure water supply line 21 to correspond to each of the mixing tanks 11 and 12. The first pure water flow rate control opening/closing valves 26 serve as flow rate control valves capable of controlling a flow rate of pure water flowing through the first pure water supply line 21 when they are opened.

In the same manner as the first pure water supply line 21, the second pure water supply line 22 is branched on its way and connected to each of the first mixing tank 11 and the second mixing tank 12. Further, the second pure water supply line 22 includes second pure water flow rate control opening/closing valves 27. To be specific, the second pure water flow rate control opening/closing valves 27 are provided at a downstream side of a branch portion 22a of the second pure water supply line 22 to correspond to each of the mixing tanks 11 and 12. The second pure water flow rate control opening/closing valves 27 serve as flow rate control valves capable of controlling a flow rate of pure water flowing through the second pure water supply line 22 when they are opened.

A second pure water flow rate measurement device 28 is provided at an upstream side of the branch portion 22a of the second pure water supply line 22. By adding up the flow rates of the pure water measured by the second pure water flow rate measurement device 28, it is possible to obtain a supply amount of pure water flowing through the second pure water supply line 22 to be supplied to the each of the mixing tanks 11 and 12. Further, in the present illustrative embodiment, the second pure water flow rate measurement device 28 has a smaller measurement range than the first pure water flow rate measurement device 24 to correspond to a low flow rate at the second pure water supply line 22. However, if the first pure water flow rate measurement device 24 can measure both a high flow rate of pure water flowing through the first pure water supply line 21 and a low flow rate of pure water flowing through the second pure water supply line 22, the second pure water flow rate measurement device 28 may be omitted.

Hereinafter, a system for sulfuric acid will be explained.

As depicted in FIG. 3, each of the mixing tanks 11 and 12 is connected to a sulfuric acid supply unit that supplies sulfuric acid to the mixing tanks 11 and 12. In the present illustrative embodiment, the sulfuric acid supply unit is configured as a sulfuric acid weighing tank (sulfuric acid storage tank) capable of storing and weighing sulfuric acid. The sulfuric acid weighing tank 30 is positioned higher than the each of the mixing tanks 11 and 12. Thus, sulfuric acid can be supplied to the each of the mixing tanks 11 and 12 by its weight thereof without using a driving force such as a pump.

The sulfuric acid weighing tank 30 is connected to each of the mixing tanks 11 and 12 through a first sulfuric acid supply line 31 and a second sulfuric acid supply line 32 parallel to each other. A flow rate of sulfuric acid at the second sulfuric acid supply line 32 (low flow rate sulfuric acid supply line) is lower than a flow rate of sulfuric acid at the first sulfuric acid supply line 31 (high flow rate sulfuric acid supply line). An upstream end portion (end portion at a side of the sulfuric acid weighing tank 30) of the first sulfuric acid supply line 31 and an upstream end portion of the second sulfuric acid supply line 32 are connected to the sulfuric acid weighing tank 30 via a main sulfuric acid supply line 33.

A downstream end portion of the first sulfuric acid supply line 31 is connected to the mixing tanks 11 and 12. That is, the first sulfuric acid supply line 31 is branched on its way and connected to each of the first mixing tank 11 and the second mixing tank 12. Further, first sulfuric acid supply opening/closing valves 34 are provided between the sulfuric acid weighing tank 30 and the each of the mixing tanks 11 and 12. To be specific, the first sulfuric acid supply opening/closing valves 34 are provided at a downstream side of a branch portion 31a of the first sulfuric acid supply line 31 to correspond to each of the mixing tanks 11 and 12.

A first sulfuric acid supply flow rate control valve is provided at an upstream side of the of the branch portion 31a of the first sulfuric acid supply line 31. The first sulfuric acid supply flow rate control valve 35 controls a flow rate of sulfuric acid at the first sulfuric acid supply line 31. The first sulfuric acid supply flow rate control valve 35 and a second sulfuric acid supply flow rate control valve 37 to be described later can control a flow rate of sulfuric acid at the first sulfuric acid supply line 31 to be higher than a flow rate of sulfuric acid at the second sulfuric acid supply line 32. Further, a flow path cross sectional area of the first sulfuric acid supply flow rate control valve 35 can be adjusted to be smaller than a flow path cross sectional area of the first sulfuric acid supply line 31. Therefore, a supply flow rate of sulfuric acid at the first sulfuric acid supply line 31 can be lowered. Thus, supply flow rates of sulfuric acid to the mixing tanks 11 and 12 are controlled to supply sulfuric acid to the mixing tanks 11 and 12 at a low flow rate, and suppress a partial increase in temperature of a chemical liquid caused by an exothermic reaction between sulfuric acid and water within the mixing tanks 11 and 12.

In the same manner as the first sulfuric acid supply line 31, the second sulfuric acid supply line 32 is branched on its way and connected to each of the first mixing tank 11 and the second mixing tank 12. Further, second sulfuric acid supply opening/closing valves 36 are provided between the sulfuric acid weighing tank 30 and the each of the mixing tanks 11 and 12. To be specific, the second sulfuric acid supply opening/closing valves 36 are provided at a downstream side of a branch portion 32a of the second sulfuric acid supply line 32 to correspond to each of the mixing tanks 11 and 12.

The second sulfuric acid supply flow rate control valve 37 is provided at an upstream side of the of the branch portion 32a of the second sulfuric acid supply line 32. The second sulfuric acid supply flow rate control valve 37 controls a flow rate of sulfuric acid at the second sulfuric acid supply line 32. The second sulfuric acid supply flow rate control valve 37 and the above-described first sulfuric acid supply flow rate control valve 35 can control a flow rate of sulfuric acid at the second sulfuric acid supply line 32 to be lower than a flow rate of sulfuric acid at the first sulfuric acid supply line 31.

As depicted in FIG. 3, the sulfuric acid weighing tank 30 is connected to a sulfuric acid supply source 40 that supplies sulfuric acid to the sulfuric acid weighing tank 30 under pressurization. The sulfuric acid supply source 40 and the sulfuric acid weighing tank 30 are connected through a sulfuric acid storage unit 48. The sulfuric acid storage unit 48 will be explained in detail below.

That is, the sulfuric acid supply source 40 is connected to the sulfuric acid weighing tank 30 through a first sulfuric acid storage line 41 and a second sulfuric acid storage line 42 parallel to each other. A flow rate of sulfuric acid at the second sulfuric acid storage line 42 (low flow rate sulfuric acid storage line) is lower than a flow rate of sulfuric acid at the first sulfuric acid storage line 41 (high flow rate sulfuric acid storage line). An upstream end portion (end portion at a side of the sulfuric acid supply source 40) of the first sulfuric acid storage line 41 and an upstream end portion of the second sulfuric acid storage line 42 are joined to be connected to the sulfuric acid supply source 40. Further, a downstream end portion of the first sulfuric acid storage line 41 and a downstream end portion of the second sulfuric acid storage line 42 are joined to be connected to the main sulfuric acid supply line 33.

The first sulfuric acid storage line 41 includes a first sulfuric acid storage opening/closing valve 43. The first sulfuric acid storage opening/closing valve 43 serves as a flow rate control valve capable of controlling a flow rate of sulfuric acid when it is opened. The first sulfuric acid storage opening/closing valve 43 and a sulfuric acid storage flow rate control valve 45 to be described later can control a flow rate of sulfuric acid at the first sulfuric acid storage line 41 to be higher than a flow rate of sulfuric acid at the second sulfuric acid storage line 42.

The second sulfuric acid storage line 42 includes a second sulfuric acid storage opening/closing valve 44 and the sulfuric acid storage flow rate control valve 45 provided at an upstream side of the second sulfuric acid storage opening/closing valve 44. The sulfuric acid storage flow rate control valve 45 and the above-described first sulfuric acid storage opening/closing valve 43 can control a flow rate of sulfuric acid at the second sulfuric acid storage line 42 to be lower than a flow rate of sulfuric acid at the first sulfuric acid storage line 41.

The sulfuric acid weighing tank 30 includes liquid surface level sensors 30a and 30b for supplying sulfuric acid configured to detect a liquid surface of sulfuric acid stored in the sulfuric acid weighing tank 30. That is, the sulfuric acid weighing tank 30 includes a first sulfuric acid liquid surface level sensor 30a provided at a position corresponding to a liquid surface of sulfuric acid stored in a first sulfuric acid storage amount and a second sulfuric acid liquid surface level sensor 30b provided at a position corresponding to a liquid surface of sulfuric acid stored in a second sulfuric acid storage amount smaller than the first sulfuric acid storage amount.

Further, the sulfuric acid weighing tank 30 includes liquid surface level sensors 30c and 30d for storing sulfuric acid configured to detect a liquid surface of sulfuric acid stored in the sulfuric acid weighing tank 30. That is, the sulfuric acid weighing tank 30 includes a third sulfuric acid liquid surface level sensor 30c provided at a position corresponding to a liquid surface of sulfuric acid stored in a third sulfuric acid storage amount greater than the first sulfuric acid storage amount and a fourth sulfuric acid liquid surface level sensor 30d provided at a position corresponding to a liquid surface of sulfuric acid stored in a fourth sulfuric acid storage amount greater than the third sulfuric acid storage amount.

Herein, the first sulfuric acid storage amount is set in order to determine timing of changing a supply flow rate of sulfuric acid when the sulfuric acid is supplied from the sulfuric acid weighing tank 30 to the mixing tanks 11 and 12. The third sulfuric acid storage amount is set in order to determine timing of changing a storage flow rate of sulfuric acid when the sulfuric acid is supplied from the sulfuric acid supply source 40 to the sulfuric acid weighing tank 30 to be stored therein. Further, the second sulfuric acid storage amount and the fourth sulfuric acid storage amount are set in order to determine a supply amount of sulfuric acid to be supplied to the mixing tanks 11 and 12, so that it is possible to control a chemical liquid to have a desired concentration.

A fifth sulfuric acid liquid surface level sensor 30e is provided under the second sulfuric acid liquid surface level sensor 30b. The fifth sulfuric acid liquid surface level sensor 30e is capable of detecting a state (empty state) where sulfuric acid is not stored in the sulfuric acid weighing tank 30. Further, a sixth sulfuric acid liquid surface level sensor 30f is provided above the fourth sulfuric acid liquid surface level sensor 30d. The sixth sulfuric acid liquid surface level sensor 30f is capable of detecting a state (full state) where the sulfuric acid weighing tank 30 is full of sulfuric acid.

When sulfuric acid is supplied (stored) into the sulfuric acid weighing tank 30 from the sulfuric acid supply source 40, if it is determined that a storage amount of sulfuric acid in the sulfuric acid weighing tank 30 is smaller than the third sulfuric acid storage amount (a second preset amount) based on a sensor signal from the third sulfuric acid liquid surface level sensor 30c, the controller 300 opens the first sulfuric acid storage opening/closing valve 43 and the second sulfuric acid storage opening/closing valve 44. That is, sulfuric acid is supplied to the sulfuric acid weighing tank 30 from the sulfuric acid supply source 40 through the first sulfuric acid storage line 41 and the second sulfuric acid storage line 42. In this case, the sulfuric acid is supplied to the sulfuric acid weighing tank 30 at a total flow rate (a first sulfuric acid storage flow rate) including a flow rate at the first sulfuric acid storage line 41 and a flow rate at the second sulfuric acid storage line 42. Therefore, it is possible to increase a supply rate of sulfuric acid to be supplied to the sulfuric acid weighing tank 30 from the sulfuric acid supply source 40.

Further, if it is determined that a storage amount of sulfuric acid in the sulfuric acid weighing tank 30 is equal to or larger than the third sulfuric acid storage amount and is smaller than the fourth sulfuric acid storage amount based on sensor signals from the third sulfuric acid liquid surface level sensor 30c and the fourth sulfuric acid liquid surface level sensor 30d, the controller maintains the second sulfuric acid storage opening/closing valve 44 in an open state and closes the first sulfuric acid storage opening/closing valve 43. That is, sulfuric acid is supplied to the sulfuric acid weighing tank 30 from the sulfuric acid supply source 40 through the second sulfuric acid storage line 42 only. In this case, the sulfuric acid is supplied to the sulfuric acid weighing tank 30 at a flow rate (a second sulfuric acid storage flow rate lower than the first sulfuric acid storage flow rate) at the second sulfuric acid storage line 42. Therefore, it is possible to decrease a storage rate of sulfuric acid.

Furthermore, if it is determined that a storage amount of sulfuric acid in the sulfuric acid weighing tank reaches the fourth sulfuric acid storage amount (a third preset amount)

based on a sensor signal from the fourth sulfuric acid liquid surface level sensor 30d, the controller 300 closes the second sulfuric acid storage opening/closing valve 44. That is, the controller 300 stops supplying sulfuric acid through the second sulfuric acid storage line 42.

In this way, sulfuric acid is supplied into the sulfuric acid weighing tank 30 from the sulfuric acid supply source 40 to be stored therein, so that it is possible to shorten a storage time of sulfuric acid and also possible to improve accuracy of timing of stopping storage of sulfuric acid. Thus, accuracy of a storage amount (weighed amount) of sulfuric acid can be improved.

Meanwhile, when sulfuric acid is supplied from the sulfuric acid weighing tank 30 to the first mixing tank 11, if it is determined that a storage amount of sulfuric acid in the sulfuric acid weighing tank 30 is the fourth sulfuric acid storage amount based on the sensor signal from the fourth sulfuric acid liquid surface level sensor 30d, the controller 300 opens the first sulfuric acid supply opening/closing valves 34 and the second sulfuric acid supply opening/closing valves 36. That is, sulfuric acid is supplied from the sulfuric acid weighing tank 30 to the first mixing tank 11 through the first sulfuric acid supply line 31 and the second sulfuric acid supply line 32. In this case, the sulfuric acid is supplied to the first mixing tank 11 at a total flow rate (a first sulfuric acid supply flow rate) including a flow rate at the first sulfuric acid supply line 31 and a flow rate at the second sulfuric acid supply line 32. Therefore, it is possible to increase a supply rate of sulfuric acid to be supplied from the sulfuric acid weighing tank 30 to the first mixing tank 11.

Moreover, if it is determined that a storage amount of sulfuric acid in the sulfuric acid weighing tank 30 is equal to or larger than the second sulfuric acid storage amount and is smaller than the first sulfuric acid storage amount (a first preset amount) based on the sensor signals from the first sulfuric acid liquid surface level sensor 30a and the second sulfuric acid liquid surface level sensor 30b, the controller 300 maintains the second sulfuric acid supply opening/closing valves 36 in an open state and closes the first sulfuric acid supply opening/closing valves 34. That is, sulfuric acid is supplied from the sulfuric acid weighing tank 30 to the first mixing tank 11 through the second sulfuric acid supply line 32 only. In this case, the sulfuric acid is supplied to the first mixing tank 11 at the flow rate (a second sulfuric acid supply flow rate lower than the first sulfuric acid supply flow rate) at the second sulfuric acid supply line 32. Therefore, it is possible to decrease a supply rate of sulfuric acid.

Besides, if it is determined that a storage amount of sulfuric acid in the sulfuric acid weighing tank 30 is smaller than the second sulfuric acid storage amount based on the sensor signal from the second sulfuric acid liquid surface level sensor 30b, the controller 300 closes the second sulfuric acid supply opening/closing valves 36. That is, the controller 300 stops supplying sulfuric acid through the second sulfuric acid supply line 32.

In this way, sulfuric acid is supplied into the first mixing tank 11 from the sulfuric acid weighing tank 30, so that it is possible to shorten a supplying time of sulfuric acid and also possible to improve accuracy of timing of stopping supply of sulfuric acid. Thus, accuracy of a supply amount of sulfuric acid can be improved. Although there has been explained a case where sulfuric acid is supplied to the first mixing tank 11, supply of sulfuric acid to the second mixing tank 12 is performed in the same manner as the supply of sulfuric acid to the first mixing tank 11. Therefore, explanation of the supply of sulfuric acid to the second mixing tank 12 will be omitted.

Hereinafter, a system for hydrogen peroxide solution will be explained. Since the system for hydrogen peroxide solution has the same configuration as the system for sulfuric acid, same parts will be explained briefly and detailed explanations thereof will be omitted.

As depicted in FIG. 3, each of the mixing tanks 11 and 12 is connected to a hydrogen peroxide solution supply unit that supplies hydrogen peroxide solution to the mixing tanks 11 and 12. In the present illustrative embodiment, the hydrogen peroxide solution supply unit is configured as a hydrogen peroxide solution weighing tank 50 capable of storing and weighing hydrogen peroxide solution. The hydrogen peroxide solution weighing tank 50 is connected to each of the mixing tanks 11 and 12 through a first hydrogen peroxide solution supply line 51, a second hydrogen peroxide solution supply line 52, and a main hydrogen peroxide solution supply line 53. First hydrogen peroxide solution supply opening/closing valves 54 are provided at a downstream side of a branch portion 51a of the first hydrogen peroxide solution supply line 51. The first hydrogen peroxide solution supply opening/closing valves 54 serve as flow rate control valves capable of controlling a flow rate of hydrogen peroxide solution when they are opened. Second hydrogen peroxide solution supply opening/closing valves 56 are provided at a downstream side of a branch portion 52a of the second hydrogen peroxide solution supply line 52. Further, a hydrogen peroxide solution supply flow rate control valve 57 is provided at an upstream side of the branch portion 52a of the second hydrogen peroxide solution supply line 52. The hydrogen peroxide solution supply flow rate control valve 57 controls a flow rate of hydrogen peroxide solution at the second hydrogen peroxide solution supply line 52. The hydrogen peroxide solution supply flow rate control valve 57 controls a flow rate of hydrogen peroxide solution at the second hydrogen peroxide solution supply line 52 to be lower than a flow rate of hydrogen peroxide solution at the first hydrogen peroxide solution supply line 51.

As depicted in FIG. 3, the hydrogen peroxide solution weighing tank 50 is connected to a hydrogen peroxide solution supply source 60 that supplies hydrogen peroxide solution to the hydrogen peroxide solution weighing tank 50 under pressurization. The hydrogen peroxide solution supply source 60 and the hydrogen peroxide solution weighing tank 50 are connected to each other through a hydrogen peroxide solution storage unit 68 having the same configuration and same function as the sulfuric acid storage unit 48.

Further, the hydrogen peroxide solution weighing tank 50 includes first to sixth hydrogen peroxide solution liquid surface level sensors 50a to 50f configured to detect a liquid surface of hydrogen peroxide solution stored in the hydrogen peroxide solution weighing tank 50. The hydrogen peroxide solution liquid surface level sensors 50a to 50f have the same configuration and same function as the sulfuric acid liquid surface level sensors 30a to 30f provided in the sulfuric acid weighing tank 30.

A supply (storage) of hydrogen peroxide solution from the hydrogen peroxide solution supply source 60 to the hydrogen peroxide solution weighing tank 50 can be performed in the same manner as the supply (storage) of sulfuric acid from the sulfuric acid supply source 40 to the sulfuric acid weighing tank 30. Further, supply of hydrogen peroxide solution from the hydrogen peroxide solution weighing tank 50 to the mixing tanks 11 and 12 can be performed in the same manner as the supply of sulfuric acid from the sulfuric acid weighing tank 30 to the mixing tanks 11 and 12.

Hereinafter, a system for hydrofluoric acid will be explained. Since the system for hydrofluoric acid has the same configuration as the system for sulfuric acid, same parts will be explained briefly and detailed explanations thereof will be omitted.

As depicted in FIG. 3, each of the mixing tanks 11 and 12 is connected to a hydrofluoric acid supply unit that supplies hydrofluoric acid to the mixing tanks 11 and 12. In the present illustrative embodiment, the hydrofluoric acid supply unit is configured as a first hydrofluoric acid weighing tank 70 and a second hydrofluoric acid weighing tank 85 that are capable of storing and weighing hydrofluoric acid. The first hydrofluoric acid weighing tank 70 is connected to each of the mixing tanks 11 and 12 through a first hydrofluoric acid supply line 71, a second hydrofluoric acid supply line 72, and a main hydrofluoric acid supply line 73. First hydrofluoric acid supply opening/closing valves 74 are provided at a downstream side of a branch portion 71a of the first hydrofluoric acid supply line 71. The first hydrofluoric acid supply opening/closing valves 74 serve as flow rate control valves capable of controlling a flow rate of hydrofluoric acid when they are opened. Second hydrofluoric acid supply opening/closing valves 76 are provided at a downstream side of a branch portion 72a of the second hydrofluoric acid supply line 72. Further, a hydrofluoric acid flow rate control valve 77 is provided at an upstream side of the branch portion 72a of the second hydrofluoric acid supply line 72. The hydrofluoric acid flow rate control valve 77 controls a flow rate of hydrofluoric acid at the second hydrofluoric acid supply line 72. The hydrofluoric acid flow rate control valve 77 controls a flow rate of hydrofluoric acid at the second hydrofluoric acid supply line 72 to be lower than a flow rate of hydrofluoric acid at the first hydrofluoric acid supply line 71.

Further, the first hydrofluoric acid weighing tank 70 is connected to each of the mixing tanks 11 and 12 through a third hydrofluoric acid supply line 78 (fixed-quantity hydrofluoric acid supply line) parallel to the second hydrofluoric acid supply line 72. The third hydrofluoric acid supply line 78 includes a fixed-quantity pump 79. The fixed-quantity pump 79 is configured to measure a supply amount of hydrofluoric acid flowing through the third hydrofluoric acid supply line 78. With this configuration, if hydrofluoric acid is supplied to the mixing tanks 11 and 12 through the third hydrofluoric acid supply line 78, the fixed-quantity pump 79 sets a supply amount of hydrofluoric acid to be supplied to each of the mixing tanks 11 and 12. Thus, a supply flow rate of hydrofluoric acid to be supplied to each of the mixing tanks 11 and 12 can be changed flexibly. It is appropriate for the third hydrofluoric acid supply line 78 to be used, for example, to change a concentration of a chemical liquid within the mixing tanks 11 and 12.

In the same manner as the second hydrofluoric acid supply line 72, the third hydrofluoric acid supply line 78 is branched on its way and connected to each of the first mixing tank 11 and the second mixing tank 12. Further, third hydrofluoric acid supply opening/closing valves 80 are provided between the first hydrofluoric acid weighing tank 70 and each of the mixing tanks 11 and 12. To be specific, the third hydrofluoric acid supply opening/closing valves 80 are provided at a downstream side of a branch portion 78a of the third hydrofluoric acid supply line 78 to correspond to each of the mixing tanks 11 and 12. The above-described fixed-quantity pump 79 is provided at an upstream side of the branch portion 78a of the third hydrofluoric acid supply line 78.

As depicted in FIG. 3, the first hydrofluoric acid weighing tank 70 is connected to a hydrofluoric acid supply source 90 that supplies hydrofluoric acid to the first hydrofluoric acid weighing tank 70 under pressurization. The hydrofluoric acid supply source 90 and the first hydrofluoric acid weighing tank 70 are connected to each other through a hydrofluoric acid storage unit 98 having the same configuration and same function as the sulfuric acid storage unit 48.

Further, the first hydrofluoric acid weighing tank 70 includes first to sixth hydrofluoric acid liquid surface level sensors 70a to 70f configured to detect a liquid surface of hydrofluoric acid stored in the first hydrofluoric acid weighing tank 70. The hydrofluoric acid liquid surface level sensors 70a to 70f have the same configuration and same function as the sulfuric acid liquid surface level sensors 30a to 30f provided in the sulfuric acid weighing tank 30.

Furthermore, in the present illustrative embodiment, as depicted in FIG. 3, the first hydrofluoric acid weighing tank 70 includes a seventh hydrofluoric acid liquid surface level sensor 70g provided at a position corresponding to a liquid surface of hydrofluoric acid stored in a seventh hydrofluoric acid storage amount which is greater than a first hydrofluoric acid storage amount and smaller than a third hydrofluoric acid storage amount and an eighth hydrofluoric acid liquid surface level sensor 70h provided at a position corresponding to a liquid surface of hydrofluoric acid stored in an eighth hydrofluoric acid storage amount smaller than the seventh hydrofluoric acid storage amount.

A supply (storage) of hydrofluoric acid from the hydrofluoric acid supply source 90 to the first hydrofluoric acid weighing tank 70 can be performed in the same manner as the supply (storage) of sulfuric acid from the sulfuric acid supply source 40 to the sulfuric acid weighing tank 30. Further, a supply of hydrofluoric acid from the first hydrofluoric acid weighing tank 70 to the mixing tanks 11 and 12 can be performed in the same manner as the supply of sulfuric acid from the sulfuric acid weighing tank 30 to the mixing tanks 11 and 12.

Further, sulfuric acid can be supplied to the first mixing tank 11 through the third hydrofluoric acid supply line 78 from the first hydrofluoric acid weighing tank 70 that stores hydrofluoric acid in the third hydrofluoric acid storage amount. In this case, the controller 300 opens the third hydrofluoric acid supply opening/closing valves 80 and operates the fixed-quantity pump 79 to supply hydrofluoric acid to the first mixing tank 11. After a certain amount of hydrofluoric acid is supplied to the first mixing tank 11, the operation of the fixed-quantity pump 79 is stopped.

In the present illustrative embodiment, as depicted in FIG. 3, the second hydrofluoric acid weighing tank 85 may store and weigh hydrofluoric acid, and may have a cross sectional area smaller than that of the first hydrofluoric acid weighing tank 70. The second hydrofluoric acid weighing tank 85 as well as the first hydrofluoric acid weighing tank 70 is positioned higher than the mixing tanks 11 and 12. Thus, hydrofluoric acid stored in the second hydrofluoric acid weighing tank 85 can be supplied to the mixing tanks 11 and 12 by its weight thereof without using a driving force such as a pump.

The second hydrofluoric acid weighing tank 85 includes first to sixth hydrofluoric acid liquid surface level sensors 85a to 85f configured the same as the hydrofluoric acid liquid surface level sensors 70a to 70f of the first hydrofluoric acid weighing tank 70. Thus, in the same manner as the first hydrofluoric acid weighing tank 70, hydrofluoric acid can be supplied from the hydrofluoric acid supply source 90 to the second hydrofluoric acid weighing tank 85 to be stored therein and hydrofluoric acid can be supplied to the mixing tanks 11 and 12.

The main hydrofluoric acid supply line 73 is branched on its way and connected to the first hydrofluoric acid weighing tank 70 and the second hydrofluoric acid weighing tank 85. Further, at an upstream side of a branch portion 73a of the main hydrofluoric acid supply line 73, a first main hydrofluoric acid opening/closing valve 86 and a second main hydrofluoric acid opening/closing valve 87 are provided to correspond to each of the hydrofluoric acid weighing tanks 70 and 85. The controller 300 controls the first main hydrofluoric acid opening/closing valve 86 and the second main hydrofluoric acid opening/closing valve 87, so that hydrofluoric acid can be selectively supplied from the hydrofluoric acid supply source 90 to the first hydrofluoric acid weighing tank 70 or the second hydrofluoric acid weighing tank 85 to be stored therein. Further, a hydrofluoric acid weighing tank for supplying hydrofluoric acid to the mixing tanks 11 and 12 can be selected. By using the second hydrofluoric acid weighing tank 85 having a small bottom area, it is possible to reduce effects caused by detection errors of the hydrofluoric acid liquid surface level sensors. Thus, it is possible to further improve accuracy of weighing hydrofluoric acid.

Hereinafter, there will be explained a circulation line 100 in which the chemical liquid produced in the mixing tanks 11 and 12 are circulated and cooled.

As depicted in FIG. 3, each of the mixing tanks 11 and 12 is connected to the circulation line 100 including a circulation pump 101. The circulation line 100 includes a temperature controller 102 configured to heat or cool a chemical liquid flowing through the circulation line 100 and a water-cooling type cooling unit 103 configured to cool the chemical liquid. The temperature controller 102 is provided at an upstream side of the circulation pump 101, and the cooling unit 103 is provided at a downstream side of the circulation pump 101. Further, the temperature controller 102 is controlled by the controller 300 to cool the chemical liquid when a temperature of the chemical liquid is higher than a target temperature and to heat the chemical liquid when a temperature of the chemical liquid is lower than the target temperature.

Further, the circulation line 100 includes a bypass line 106 through which the chemical liquid flowing through the circulation line 100 bypasses the cooling unit 103 to flow into the mixing tanks 11 and 12. That is, the circulation line 100 includes a main circulation line 104 including the temperature controller 102 and the circulation pump 101, a cooling circulation line 105 and the bypass line 106 branched from the main circulation line 104. The cooling unit 103 is provided at the cooling circulation line 105. A downstream end portion of the cooling circulation line 105 and a downstream end portion of the bypass line 106 are joined to be connected to each of the mixing tanks 11 and 12. A first circulation opening/closing valve 107 is provided at a downstream side of the circulation pump 101 of the main circulation line 104. The first circulation opening/closing valve 107 is provided at a downstream side of a connection portion 120a between the main circulation line 104 and a chemical liquid supply line 120 to be described later. Further, a second circulation opening/closing valve 108 is provided at an upstream side of the cooling unit 103 of the cooling circulation line 105. A third circulation opening/closing valve 109 is provided at a downstream side of the cooling unit 103, and a fourth circulation opening/closing valve 110 is provided at the bypass line 106.

The main circulation line 104 is connected to the above-described chemical liquid storage tank 220 via the chemical liquid supply line 120. With this configuration, the chemical liquid produced in the mixing tanks 11 and 12 is supplied to the chemical liquid storage tank 220 through the main circulation line 104 and the chemical liquid supply line 120. Further, the chemical liquid supply line 120 includes a chemical liquid supply opening/closing valve 121. Furthermore, the chemical liquid supply line 120 is branched on its way and connected to the main circulation line 104 at a side of the first mixing tank 11 and the main circulation line 104 at a side of the second mixing tank 12.

Each of the mixing tanks 11 and 12 is connected to a concentration measurement unit 132 via the main circulation line 104 and a concentration measurement line 130. With this configuration, a concentration of a chemical liquid flowing through the main circulation line 104 is measured by the concentration measurement unit 132. The concentration measurement line 130 includes a concentration measurement opening/closing valve 131. Further, the concentration measurement line 130 is branched on its way and connected to the main circulation line 104 at the side of the first mixing tank 11 and the main circulation line 104 at the side of the second mixing tank 12. In the present illustrative embodiment, a connection portion 130a between the concentration measurement line 130 and the main circulation line 104 is provided at a downstream side of the circulation pump 101 and at an upstream side of the connection portion 120a between the main circulation line 104 and the chemical liquid supply line 120.

The controller 300 controls operations of all functional components (for example, various opening/closing valves, flow rate control valves, pumps, and the like) of the liquid processing apparatus 200. The controller 300 may be formed of, for example, a general computer as hardware and computer programs (for example, a device control program, a processing recipe, and the like) for operating the general computer as software. The software is stored in a storage medium such as a hard disk drive which is fixedly installed in the computer or a storage medium such as a CD-ROM, a DVD, and a flash memory which are detachably set in the computer. The storage medium is represented by reference numeral 301 in FIG. 2. A processor 302 retrieves and executes a certain processing recipe from a storage medium 301 based on an instruction of a non-illustrated user interface as necessary. Each functional component of the liquid processing apparatus 200 operates under the control of the controller 300 and executes a certain process. The controller 300 may be a system controller that controls the entire liquid processing apparatus depicted in FIG. 1.

Hereinafter, there will be explained a series of cleaning processes for removing a polymer remaining on the wafer W with reference to FIGS. 4 to 8. A series of cleaning processes to be described below are performed by controlling each functional component of the liquid processing apparatus 200 by the controller 300 based on computer program that is stored in the storage medium 301 and is configured to perform the series of cleaning processes. Herein, a process of producing a chemical liquid in the first mixing tank 11 and a process of producing a chemical liquid in the second mixing tank 12 are performed in the same manner. Therefore, the process of producing a chemical liquid in the first mixing tank 11 will be explained but an explanation of the process of producing a chemical liquid in the second mixing tank 12 will be omitted.

A liquid processing method in accordance with the present illustrative embodiment includes a chemical liquid producing process of producing a chemical liquid by mixing supplied pure water, sulfuric acid, hydrogen peroxide solution, and hydrofluoric acid in the first mixing tank 11 and a liquid process of processing the wafer W with the produced chemical liquid. The chemical liquid producing process will be explained first. Herein, for the sake of convenience, there will be explained a case where the following process is performed in the empty first mixing tank 11 having no chemical liquid, sulfuric acid is stored in the third sulfuric acid storage amount in the sulfuric acid weighing tank 30, hydrogen peroxide solution is stored in a third hydrogen peroxide solution storage amount in the hydrogen peroxide solution weighing tank 50, and hydrofluoric acid is stored in the third hydrofluoric acid storage amount in the first hydrofluoric acid weighing tank 70.

Figure 4:
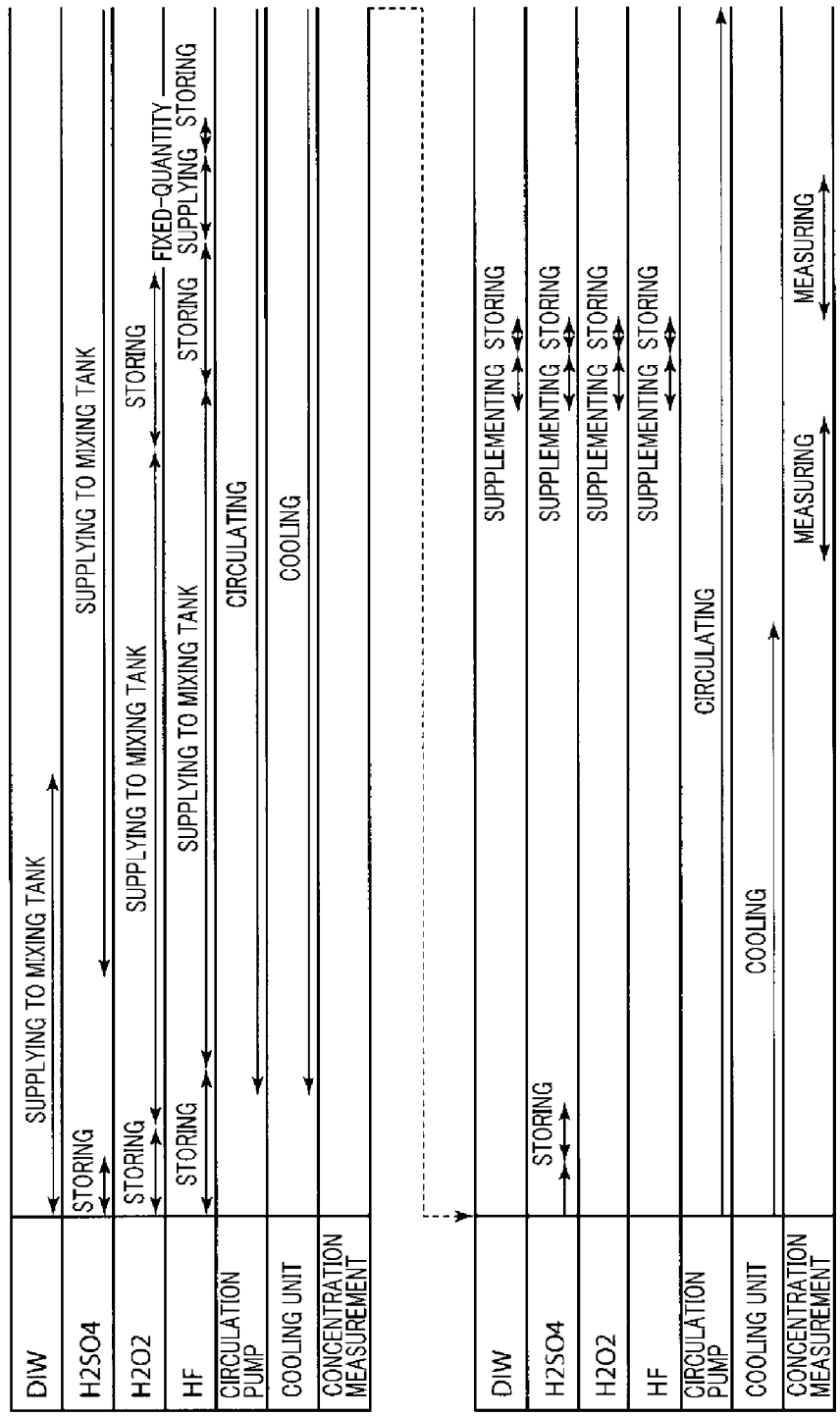
FIG. 4 is a time chart of a liquid processing method in accordance with the illustrative embodiment of the present disclosure.
Figure 5:
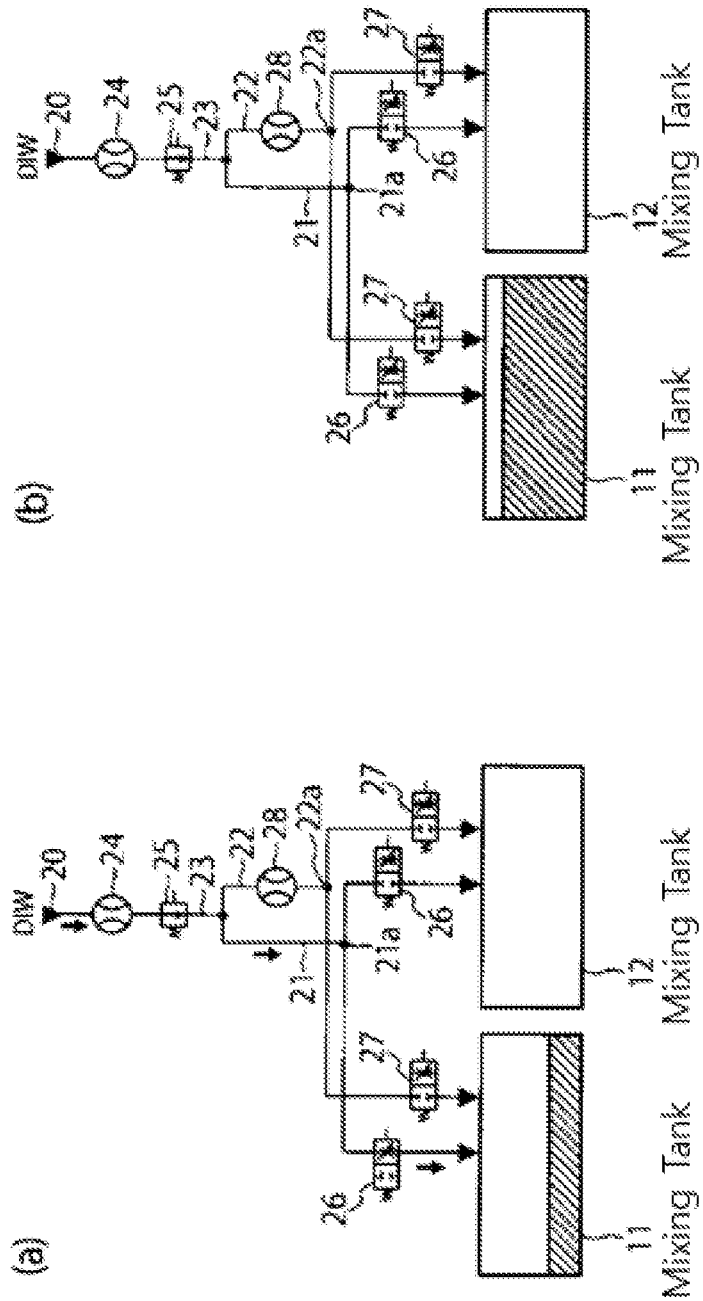
FIGS. 5(a) and 5(b) illustrate sequences of supplying and storing pure water in the liquid processing method of FIG. 4.

In the chemical liquid producing process, as depicted in FIG. 4, pure water is supplied from the pure water supply source 20 to the first mixing tank 11. That is, as depicted in FIG. 5(*a*), the first pure water flow rate control opening/closing valve 26 is opened and the pure water is supplied from the pure water supply source 20 to the first mixing tank 11 at the first pure water supply flow rate through the first pure water supply line 21. While the pure water is supplied, a flow rate of the pure water is measured by the first pure water flow rate measurement device 24 and the measured flow rate of the pure water is added up. Thus, a supply amount of the pure water to be supplied to the first mixing tank 11 can be obtained. After the supply amount of the pure water to be supplied to the first mixing tank 11 reaches a preset supply amount, the first pure water flow rate control opening/closing valve 26 is controlled such that the flow rate of the pure water is lowered. That is, the pure water is supplied to the first mixing tank 11 at the second pure water supply flow rate which is lower than the first pure water supply flow rate. Thus, a supply rate of the pure water to the first mixing tank 11 is decreased. Then, the pure water is supplied through the first pure water supply line 21 at the second pure water supply flow rate. After a supply amount of the pure water reaches a target supply amount of pure water for producing a mixed chemical liquid, as depicted in FIG. 5(*b*), the first pure water flow rate control opening/closing valve 26 is closed to stop the supply of the pure water.

Figure 6:
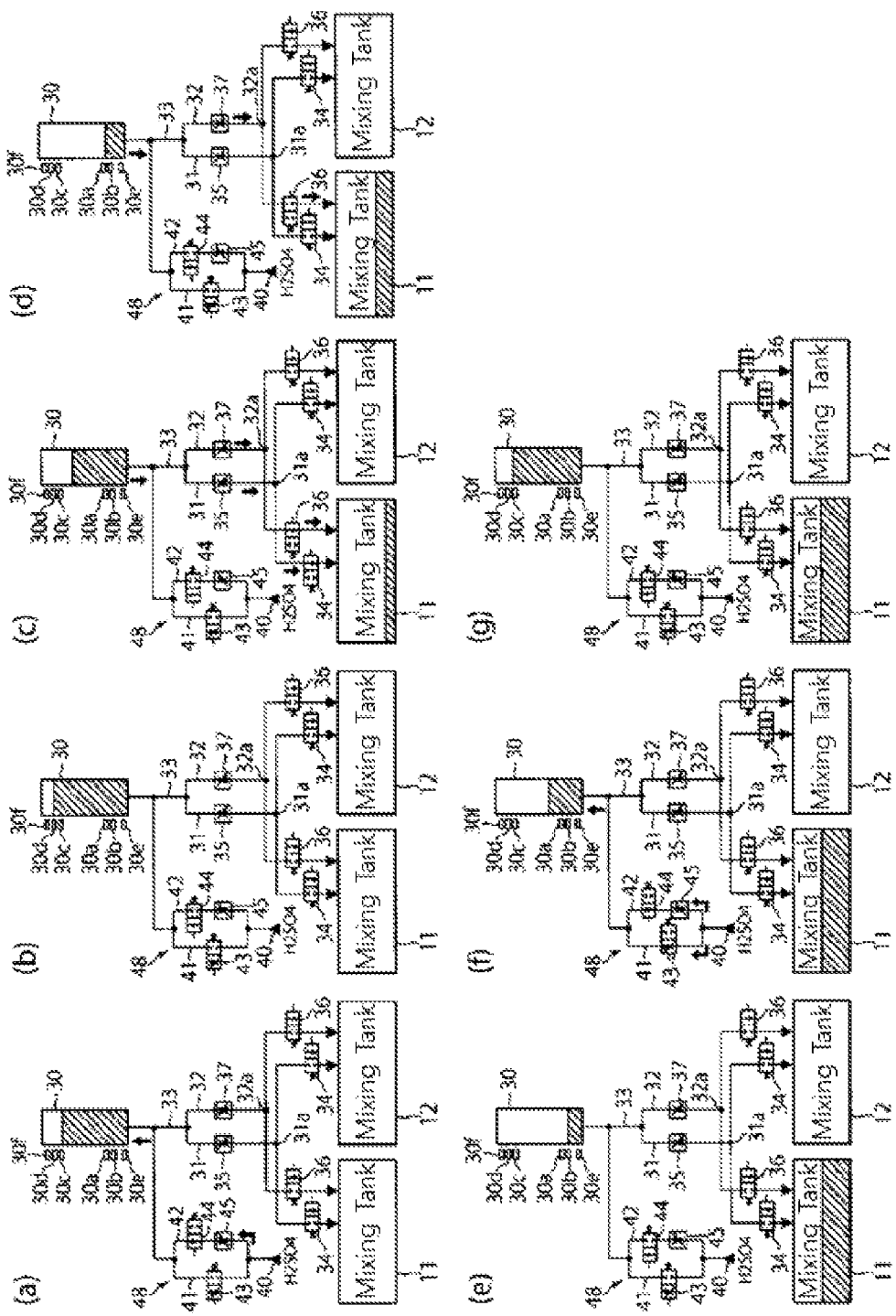
FIGS. 6(a) to 6(g) illustrate a sequence of supplying sulfuric acid in the liquid processing method of FIG. 4.

Substantially, at the same time when the supply of the pure water is started, storage (supply) of sulfuric acid from the sulfuric acid supply source 40 to the sulfuric acid weighing tank 30 is started. In this case, since sulfuric acid is already stored in the sulfuric acid weighing tank 30 in the third sulfuric acid storage amount (i.e. a storage amount of sulfuric acid reaches the third sulfuric acid storage amount and is smaller than the fourth sulfuric acid storage amount) as described above, the second sulfuric acid storage opening/closing valve 44 is opened under the control of the controller 300 as depicted in FIG. 6(*a*). Thus, the sulfuric acid is supplied from the sulfuric acid supply source 40 to the sulfuric acid weighing tank 30 at the second sulfuric acid storage flow rate smaller than the first sulfuric acid storage flow rate through the second sulfuric acid storage line 42 only to be stored in the sulfuric acid weighing tank 30. Then, after a storage amount of sulfuric acid reaches the fourth sulfuric acid storage amount (to be specific, right after the fourth sulfuric acid liquid surface level sensor 30*d* detects a storage amount of sulfuric acid reaching the fourth sulfuric acid storage amount), as depicted in FIG. 6(*b*), the second sulfuric acid storage opening/closing valve 44 is closed and the supply of the sulfuric acid to the sulfuric acid weighing tank 30 is stopped. Thus, the sulfuric acid is stored in the sulfuric acid weighing tank 30 in the fourth sulfuric acid storage amount. In this case, since a supply rate of the sulfuric acid is decreased, accuracy of timing of stopping storage of the sulfuric acid can be improved and accuracy of a storage amount (weighed amount) of the sulfuric acid can be improved.

In the same manner as the supply of the sulfuric acid to the sulfuric acid weighing tank 30, hydrogen peroxide solution is supplied from the hydrogen peroxide solution supply source 60 to the hydrogen peroxide solution weighing tank 50, and then, the hydrogen peroxide solution is stored in the hydrogen peroxide solution weighing tank 50 in a fourth hydrogen peroxide solution storage amount. Further, hydrofluoric acid is supplied from the hydrofluoric acid supply source 90 to the first hydrofluoric acid weighing tank 70, and then, the hydrofluoric acid is stored in the first hydrofluoric acid weighing tank 70 in a fourth hydrofluoric acid storage amount.

After the supply of the pure water to the first mixing tank 11 is started, an operation of the circulation pump 101 is started as depicted in FIG. 4. To be specific, after the pure water is supplied to the first mixing tank 11 in a sufficient amount for operating the circulation pump 101 (see FIG. 3), the first circulation opening/closing valve 107, the second circulation opening/closing valve 108, and the third circulation opening/closing valve 109 are opened, and then, the circulation pump 101 is operated. Thus, the pure water supplied to the first mixing tank 11 flows through the main circulation line 104 and the cooling circulation line 105 of the circulation line 100, and returns to the first mixing tank 11 to be circulated. In this case, the pure water flowing through the circulation line 100 passes through the temperature controller 102 and the cooling unit 103. Further, as depicted in FIG. 4, if the supply of the hydrogen peroxide solution to the first mixing tank 11 is started after the supply of the pure water to the first mixing tank 11 is started and before the circulation pump 101 is operated, the circulation pump 101 can be operated after the pure water and hydrogen peroxide solution supplied to the first mixing tank 11 are supplied in a sufficient amount for operating the circulation pump 101.

After the operation of the circulation pump 101 is started, as depicted in FIG. 4, the supply of the sulfuric acid is started from the sulfuric acid weighing tank 30 to the first mixing tank 11. To be specific, as depicted in FIG. 6(*c*), the sulfuric acid is stored in the sulfuric acid weighing tank 30 in the fourth sulfuric acid storage amount. Therefore, the first sulfuric acid supply opening/closing valve 34 and the second sulfuric acid supply opening/closing valve 36 are opened under the control of the controller 300. Thus, the sulfuric acid is supplied from the sulfuric acid weighing tank 30 to the first mixing tank 11 at the first sulfuric acid supply flow rate through the first sulfuric acid supply line 31 and the second sulfuric acid supply line 32. The sulfuric acid supplied to the first mixing tank 11 is rapidly diffused into the pure water being circulated through the main circulation line 104 and the cooling circulation line 105 and mixed with the pure water to produce a chemical liquid. The produced chemical liquid is cooled by the temperature controller 102 and the cooling unit 103 of the circulation line 100.

While the sulfuric acid is supplied to the first mixing tank 11, after a storage amount of the sulfuric acid in the sulfuric acid weighing tank 30 becomes smaller than the first sulfuric acid storage amount (to be specific, right after the first sulfuric acid liquid surface level sensor 30*a* detects a storage amount of the sulfuric acid smaller than the first sulfuric acid storage amount), as depicted in FIG. 6(*d*), the first sulfuric acid supply opening/closing valve 34 is closed and the supply of the sulfuric acid through the first sulfuric acid supply line 31 is stopped. Thus, the sulfuric acid is supplied from the sulfuric acid weighing tank 30 to the first mixing tank 11 at the second sulfuric acid supply flow rate lower than the first sulfuric acid supply flow rate through the second sulfuric acid supply line 32 only. In this case, a supply rate of sulfuric acid can be decreased.

Then, after a storage amount of the sulfuric acid becomes smaller than the second sulfuric acid storage amount (to be specific, right after the second sulfuric acid liquid surface level sensor 30b detects a storage amount of the sulfuric acid smaller than the second sulfuric acid storage amount), as depicted in FIG. 6(e), the second sulfuric acid supply opening/closing valve 36 is closed and the supply of the sulfuric acid to the first mixing tank 11 is stopped. In this way, the supply of the sulfuric acid to the first mixing tank 11 is ended. In this case, a supply rate of sulfuric acid can be decreased and accuracy of timing of stopping supply of sulfuric acid can be improved. Thus, accuracy of a supply amount of sulfuric acid can be improved. Further, in this case, the sulfuric acid in the second sulfuric acid storage amount remains in the sulfuric acid weighing tank 30.

After the supply of the sulfuric acid to the first mixing tank 11 is ended, sulfuric acid is supplied from the sulfuric acid supply source 40 to the sulfuric acid weighing tank 30 to be stored therein. In this case, since the sulfuric acid is stored in the sulfuric acid weighing tank in the second sulfuric acid storage amount (lower than the third sulfuric acid storage amount) as described above, the first sulfuric acid storage opening/closing valve 43 and the second sulfuric acid storage opening/closing valve 44 are opened under the control of the controller 300 as depicted in FIG. 6(f). Thus, the sulfuric acid is supplied from the sulfuric acid supply source 40 to the sulfuric acid weighing tank 30 at the first sulfuric acid storage flow rate through the first sulfuric acid storage line 41 and the second sulfuric acid storage line 42. Further, after a storage amount of the sulfuric acid reaches the third sulfuric acid storage amount, the first sulfuric acid storage opening/closing valve 43 and the second sulfuric acid storage opening/closing valve 44 are closed as depicted in FIG. 6(g). Thus, the sulfuric acid is stored in the sulfuric acid weighing tank 30 in the third sulfuric acid storage amount. Herein, after the sulfuric acid is stored in the third sulfuric acid storage amount, the supply of the sulfuric acid is stopped and the sulfuric acid in the third sulfuric acid storage amount is maintained in the sulfuric acid weighing tank 30. Thereafter, right before the supply of sulfuric acid to the first mixing tank 11 is started, sulfuric acid is supplied from the sulfuric acid supply source 40 to the sulfuric acid weighing tank 30 at the second sulfuric acid storage flow rate in the same manner as described above, and a storage amount of the sulfuric acid in the sulfuric acid weighing tank 30 is increased from the third sulfuric acid storage amount to the fourth sulfuric acid storage amount. Since the sulfuric acid is stored in the fourth sulfuric acid storage amount right before the supply of the sulfuric acid to the first mixing tank 11 is started, it is possible to prevent the sulfuric acid stored in the fourth sulfuric acid storage amount from being used for another use and to prevent the sulfuric acid from being weighed again. Further, in this case, even if a liquid surface is lowered due to volatilization within the sulfuric acid weighing tank 30 and the fourth sulfuric acid liquid surface level sensor 30d cannot detect such a lowering of the liquid surface, the supply of the sulfuric acid to the first mixing tank 11 can be started after the sulfuric acid is stored in the fourth sulfuric acid storage amount. Therefore, it is possible to prevent a decrease in a supply amount of sulfuric acid to the first mixing tank 11.

However, in the chemical liquid producing process in accordance with the present illustrative embodiment, hydrogen peroxide solution and hydrofluoric acid are supplied to the first mixing tank 11. Desirably, the supply of the hydrogen peroxide solution to the first mixing tank 11 is started after the supply of the pure water to the first mixing tank 11 is started and before the circulation pump 101 is operated as depicted in FIG. 4. The hydrogen peroxide solution is supplied to the first mixing tank 11 in the same manner as the sulfuric acid. Therefore, a detailed explanation thereof will be omitted. After the supply of the hydrogen peroxide solution to the first mixing tank 11 is ended, in the same manner as the sulfuric acid, hydrogen peroxide solution is supplied from the hydrogen peroxide solution supply source 60 to the hydrogen peroxide solution weighing tank 50 to be stored in the hydrogen peroxide solution weighing tank 50 in the third hydrogen peroxide solution storage amount.

Desirably, the supply of the hydrofluoric acid to the first mixing tank 11 is started after the circulation pump 101 is operated and before the supply of the sulfuric acid to the first mixing tank 11 is started as depicted in FIG. 4. In this case, the first main hydrofluoric acid opening/closing valve 86 is opened first and the hydrofluoric acid is supplied at a first hydrofluoric acid supply flow rate in the same manner as the sulfuric acid. Then, the hydrofluoric acid is supplied at a second hydrofluoric acid supply flow rate. Herein, details of the hydrofluoric acid supply are the same as those of the sulfuric acid supply and will be omitted. After the supply of the hydrofluoric acid to the first mixing tank 11 through the first hydrofluoric acid supply line 71 and the second hydrofluoric acid supply line 72 is ended, in the same manner as the sulfuric acid, hydrofluoric acid is supplied from the hydrofluoric acid supply source 90 to the first hydrofluoric acid weighing tank 70 to be stored in the first hydrofluoric acid weighing tank 70 in the third hydrofluoric acid storage amount.

If a concentration of the chemical liquid within the first mixing tank 11 is changed after the hydrofluoric acid is stored in the first hydrofluoric acid weighing tank 70 in the third hydrofluoric acid storage amount, hydrofluoric acid may be supplied to the first mixing tank 11 through the third hydrofluoric acid supply line 78. In this case, the third hydrofluoric acid supply opening/closing valve 80 is opened, so that the hydrofluoric acid can be supplied from the first hydrofluoric acid weighing tank 70 to the first mixing tank 11 through the third hydrofluoric acid supply line 78. Thus, the hydrofluoric acid can be supplied to the first mixing tank 11 in a desired amount set by the fixed-quantity pump 79. After the supply of the hydrofluoric acid to the first mixing tank 11 through the third hydrofluoric acid supply line 78, in the same manner of the sulfuric acid, hydrofluoric acid is supplied from the hydrofluoric acid supply source 90 to the first hydrofluoric acid weighing tank 70 to be stored in the first hydrofluoric acid weighing tank 70 in the third hydrofluoric acid storage amount.

While the sulfuric acid and the hydrofluoric acid are supplied to the first mixing tank 11, the circulation pump 101 is operated, and the chemical liquid within the first mixing tank 11 is circulated. While the chemical liquid is circulated, if a temperature of the chemical liquid is higher than a target temperature (desirably, room temperature), the first circulation opening/closing valve 107, the second circulation opening/closing valve 108, and the third circulation opening/closing valve 109 are opened as depicted in FIG. 7(a). Thus, the chemical liquid is returned to the first mixing tank 11 through the main circulation line 104 and the cooling circulation line 105. In this case, the chemical liquid is cooled by the temperature controller 102 and also cooled by the cooling unit 103.

Figure 7:
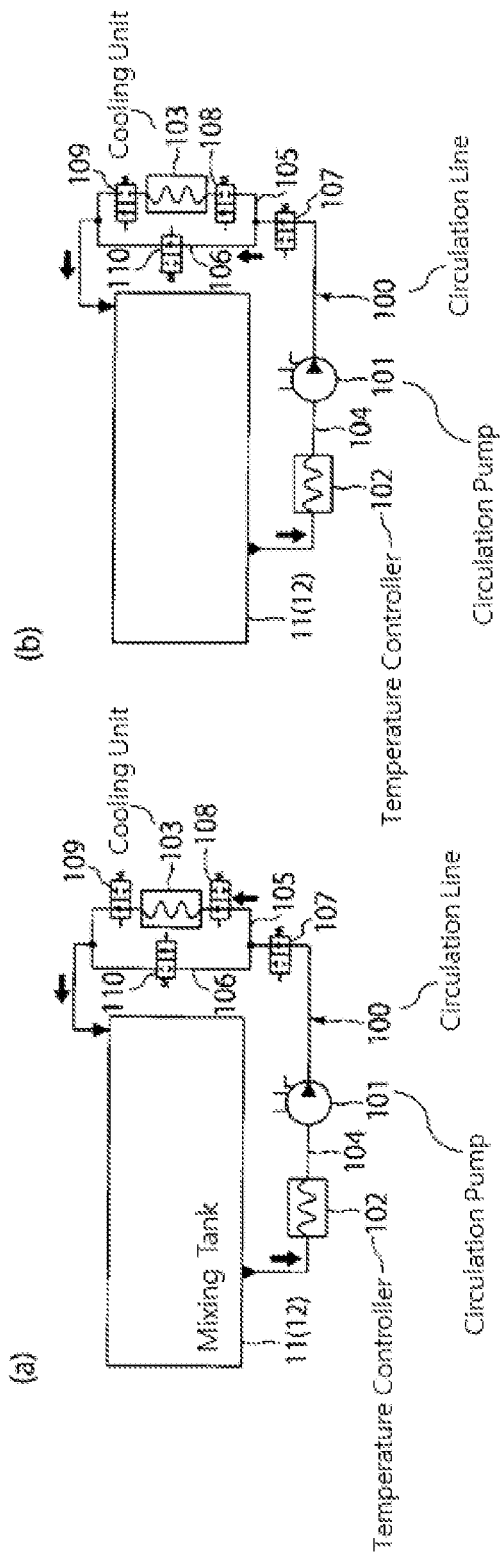
FIGS. 7(a) and 7(b) illustrate a sequence of circulation in the liquid processing method of FIG. 4.

If a temperature of the chemical liquid reaches the target temperature after the chemical liquid within the first mixing tank 11 is cooled by the temperature controller 102 and the cooling unit 103, the second circulation opening/closing valve 108 and the third circulation opening/closing valve 109 are closed, and the fourth circulation opening/closing valve 110 is opened as depicted in FIG. 7(*b*). Thus, the chemical liquid flows through the main circulation line 104 and the bypass line 106 to bypass the cooling unit 103, and then, returns to the first mixing tank 11. In this way, the cooling of the chemical liquid by the cooling unit 103 is ended. Thereafter, if a temperature of the chemical liquid is higher than the target temperature, it is cooled by the temperature controller 102 and if a temperature of the chemical liquid is lower than the target temperature, it is heated by the temperature controller 102.

After the chemical liquid starts to flow through the main circulation line 104 and the bypass line 106, a concentration of the produced chemical liquid is measured. In this case, the concentration measurement opening/closing valve 131 (see FIG. 3) is opened, and some of the chemical liquid within the main circulation line 104 is supplied to the concentration measurement unit 132 through the concentration measurement line 130. A concentration of the supplied chemical liquid is measured by the concentration measurement unit 132. Then, the concentration measurement opening/closing valve 131 is closed and the measurement of the concentration of the chemical liquid is ended. While the concentration of the chemical liquid is measured, the chemical liquid is being circulated through the main circulation line 104 and the bypass line 106 of the circulation line 100 (see FIG. 7(*b*)).

Based on the concentration of the chemical liquid measured by the concentration measurement unit 132, pure water, sulfuric acid, hydrogen peroxide solution, and hydrofluoric acid are supplied to the first mixing tank 11 in supplement amounts required to reach a target concentration, and the concentration of the chemical liquid within the first mixing tank 11 is adjusted.

Figure 8:
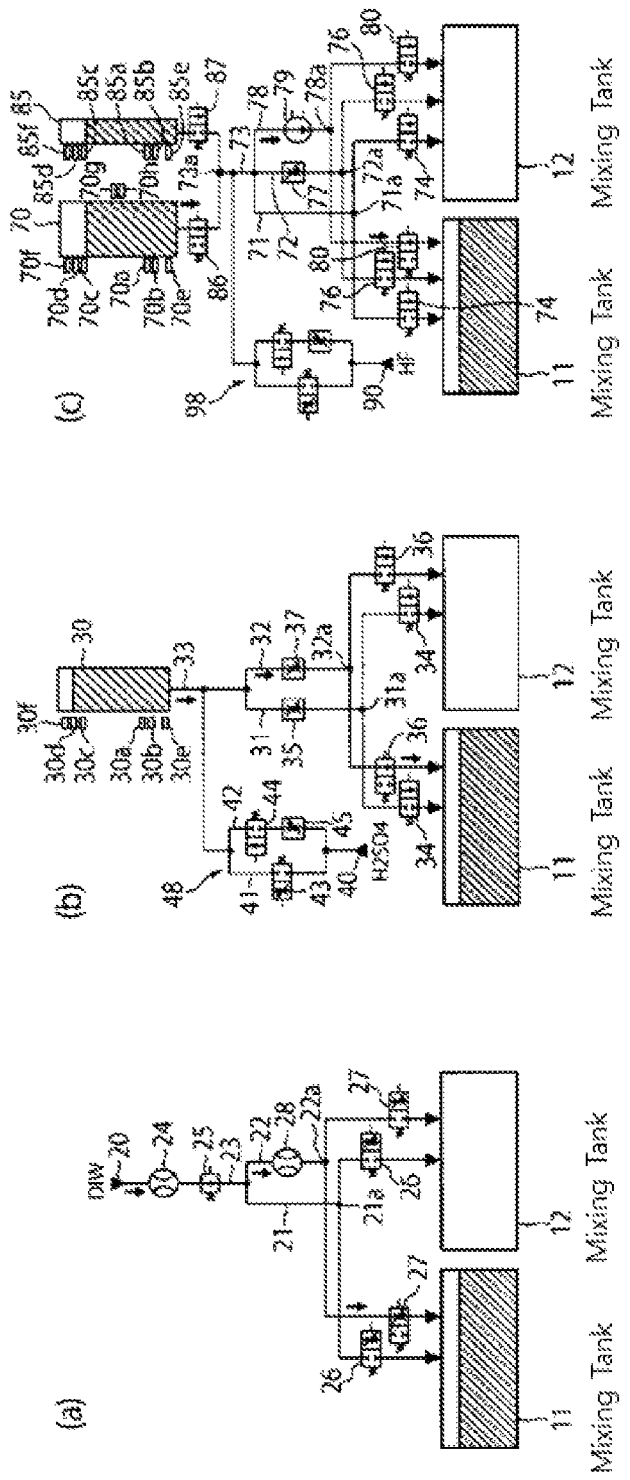
FIGS. 8(a) to 8(c) illustrate a sequence of supplementing each liquid in the liquid processing method of FIG. 4.

As depicted in FIG. 8(*a*), the pure water is supplemented (supplied) to the first mixing tank 11 from the pure water supply source 20 through the second pure water supply line 22 by opening the second pure water flow rate control opening/closing valve 27. In the meantime, a flow rate of the pure water is measured by the second pure water flow rate measurement device 28 and the measured flow rate of the pure water is added up. Thus, a supplement amount of the pure water to be supplied to the first mixing tank 11 can be obtained. After the obtained supplement amount reaches the required supplement amount, the second pure water flow rate control opening/closing valve 27 is closed and the supplement of the pure water is stopped.

As depicted in FIG. 8(*b*), the sulfuric acid is supplemented (supplied) to the first mixing tank 11 from the sulfuric acid weighing tank 30 through the second sulfuric acid supply line 32 by opening the second sulfuric acid supply opening/closing valve 36. Thus, the sulfuric acid is supplemented to the first mixing tank 11 from the sulfuric acid weighing tank 30 through the second sulfuric acid supply line 32 at the second sulfuric acid supply flow rate lower than the first sulfuric acid supply flow rate. After the sulfuric acid in the required supplement amount is supplemented to the first mixing tank 11, the second sulfuric acid supply opening/closing valve 36 is closed and the supplement of the sulfuric acid is stopped. At this time, by controlling an opening time of the second sulfuric acid supply opening/closing valve 36 based on the second sulfuric acid supply flow rate previously measured, the sulfuric acid can be supplemented in the required supplement amount. After the supplement of the sulfuric acid is stopped, sulfuric acid in an amount equivalent to the supplement amount is supplied from the sulfuric acid supply source 40 to the sulfuric acid weighing tank 30 to be stored in the sulfuric acid weighing tank 30.

In the same manner as the sulfuric acid, the hydrogen peroxide solution is supplemented to the first mixing tank 11 in a required supplement amount. After the supplement of the hydrogen peroxide solution is stopped, hydrogen peroxide solution in an amount equivalent to the supplement amount is supplied from the hydrogen peroxide solution supply source 60 to the hydrogen peroxide solution weighing tank 50 to be stored in the hydrogen peroxide solution weighing tank 50.

As depicted in FIG. 8(*c*), the hydrofluoric acid is supplemented (supplied) to the first mixing tank 11 from the first hydrofluoric acid weighing tank 70 through the third hydrofluoric acid supply line 78 by opening the first main hydrofluoric acid opening/closing valve 86 and the third hydrofluoric acid supply opening/closing valve 80. Thus, the hydrofluoric acid can be supplemented to the first mixing tank 11 from the first hydrofluoric acid weighing tank 70 through the third hydrofluoric acid supply line 78 in a required supplement amount set by the fixed-quantity pump 79. After the hydrofluoric acid in the required supplement amount is supplemented to the first mixing tank 11, the first main hydrofluoric acid opening/closing valve 86 and the third hydrofluoric acid supply opening/closing valve 80 are closed, and the supplement of the hydrofluoric acid is stopped. After the supplement of the hydrofluoric acid is stopped, hydrofluoric acid in an amount equivalent to the supplement amount is supplied from the hydrofluoric acid supply source 90 to the first hydrofluoric acid weighing tank 70 to be stored in the first hydrofluoric acid weighing tank 70.

In this way, the pure water, the sulfuric acid, the hydrogen peroxide solution, and hydrofluoric acid are respectively supplemented to the first mixing tank 11 in required supplement amounts, so that the concentration of the chemical liquid within the first mixing tank 11 may be adjusted. Thus, it is possible to improve accuracy of the concentration of the chemical liquid within the first mixing tank 11. Further, while the pure water, the sulfuric acid, the hydrogen peroxide solution, and the hydrofluoric acid are respectively supplemented, the chemical liquid is circulated through the main circulation line 104 and the bypass line 106 of the circulation line 100 (see FIG. 7(*b*)).

After the pure water, the sulfuric acid, the hydrogen peroxide solution, and the hydrofluoric acid are supplemented, the concentration of the chemical liquid is measured again in the same manner as the first-time concentration measurement. Further, even if the concentration measurement is ended after the supplement, the chemical liquid is circulated through the main circulation line 104 and the bypass line 106 of the circulation line 100.

As described above, the chemical liquid having the target temperature and the target concentration can be produced and the chemical liquid producing process is ended. After the chemical liquid producing process, a liquid process is performed on the wafer W with the produced chemical liquid (liquid process).

Above all, the chemical liquid supply opening/closing valve 121 is opened, and the chemical liquid within the first mixing tank 11 is supplied to the chemical liquid storage tank 220 (see FIG. 2) through the main circulation line 104 and the chemical liquid supply line 120.

Then, the wafer W is processed by using the chemical liquid. In this case, the chemical liquid is supplied from the chemical liquid storage tank 220 from the nozzle 216 of the liquid processing unit 210 and discharged to the wafer W held on the substrate holder 215. The chemical liquid discharged to the wafer W is dispersed to the its side direction, and the dispersed chemical liquid is guided by the cup 217 to be collected in the drain 218. The chemical liquid collected in the drain is discharged through the drain line.

Thereafter, the wafer W is rinsed by using pure water. In this case, the pure water is supplied to the nozzle 216 and discharged to the wafer W held on the substrate holder 215. Subsequently, the wafer W is dried.

The liquid process on the wafer W is ended. Then, the processed wafer W is unloaded and a next wafer W is loaded, and the same liquid process is performed on the next wafer W. The liquid process is repeatedly performed on a certain number of wafers W by using the chemical liquid stored in the chemical liquid storage tank 220.

In accordance with the present illustrative embodiment, after pure water is supplied to the mixing tanks 11 and 12 and the operation of the circulation pump 101 is started, the supply of sulfuric acid to the mixing tanks 11 and 12 is started. Thus, the sulfuric acid supplied to the mixing tanks 11 and 12 can be supplied to the pure water that is being circulated, and can be rapidly diffused into the pure water. Therefore, it is possible to suppress a partial increase in temperature of the chemical liquid caused by the exothermic reaction between the pure water and the sulfuric acid, so that it is possible to shorten the cooling time. As a result, it is possible to shorten a time for producing the chemical liquid.

Further, in accordance with the present illustrative embodiment, while the chemical liquid within the mixing tanks 11 and 12 is circulated in the circulation line 100, the chemical liquid can be cooled by the temperature controller 102 and also cooled by the cooling unit 103. Thus, it is possible to shorten a cooling time of the chemical liquid. In particular, since the cooling unit 103 is provided at the downstream side of the circulation pump 101, it is possible to surely cool the chemical liquid flowing through the circulation pump 101. As a result, it is possible to further shorten the cooling time of the chemical liquid.

Furthermore, in accordance with the present illustrative embodiment, after the temperature of the chemical liquid within the mixing tanks 11 and 12 reaches the target temperature, the chemical liquid bypasses the cooling unit 103 through the bypass line 106. Thus, it is possible to prevent the chemical liquid from being overcooled with a heat capacity (heat mass) of the cooling unit 103, so that the temperature of the chemical liquid can rapidly reach the target temperature.

Moreover, in accordance with the present illustrative embodiment, the pure water supply source 20 is respectively connected to the mixing tanks 11 and 12 through the first pure water supply line 21 and the second pure water supply line 22 parallel to each other. A flow rate of pure water at the second pure water supply line 22 is lower than a flow rate of pure water at the first pure water supply line 21. Thus, if pure water is supplied to the mixing tanks 11 and 12 through the first pure water supply line 21, it is possible to shorten a supplying time of the pure water. If pure water is supplied to the mixing tanks 11 and 12 through the second pure water supply line 22, it is possible to reduce a supply rate of the pure water to the mixing tanks 11 and 12. Therefore, accuracy of timing of stopping the supply of pure water can be improved, and, thus, accuracy of a supply amount of pure water to be supplied to the mixing tanks 11 and 12 can be improved. In particular, in accordance with the present illustrative embodiment, since the first pure water supply line 21 includes the first pure water flow rate control opening/closing valve 26, it is possible to control a flow rate of pure water at the first pure water supply line 21. In this case, if pure water is supplied through the first pure water supply line 21 at a higher flow rate (first pure water supply flow rate), it is possible to shorten a supplying time of the pure water. If pure water is supplied at a lower flow rate (second pure water supply flow rate), it is possible to improve accuracy of a supply amount of the pure water.

Further, in accordance with the present illustrative embodiment, the sulfuric acid weighing tank 30 is connected to the mixing tanks 11 and 12 through the first sulfuric acid supply line 31 and the second sulfuric acid supply line 32 parallel to each other. A flow rate of sulfuric acid at the second sulfuric acid supply line 32 is lower than a flow rate of sulfuric acid at the first sulfuric acid supply line 31. Thus, if sulfuric acid is supplied to the mixing tanks 11 and 12 through the first sulfuric acid supply line 31 and the second sulfuric acid supply line 32 at the first sulfuric acid supply flow rate, it is possible to shorten a supplying time of the sulfuric acid. If sulfuric acid is supplied to the mixing tanks 11 and 12 through the second sulfuric acid supply line 32 at the second sulfuric acid supply flow rate, it is possible to reduce a supply rate of the sulfuric acid to the mixing tanks 11 and 12. In this case, accuracy of timing of stopping the supply of sulfuric acid can be improved, and, thus, accuracy of a supply amount of sulfuric acid to be supplied to the mixing tanks 11 and 12 can be improved. In particular, in accordance with the present illustrative embodiment, sulfuric acid is supplied from the sulfuric acid weighing tank 30 to the mixing tanks 11 and 12 by using the first sulfuric acid liquid surface level sensor 30a and the second sulfuric acid liquid surface level sensor 30b. Thus, it is possible to further improve accuracy of a supply amount of sulfuric acid to be supplied to the mixing tanks 11 and 12.

Furthermore, in accordance with the present illustrative embodiment, the sulfuric acid supply source 40 is connected to the sulfuric acid weighing tank 30 through the first sulfuric acid storage line 41 and the second sulfuric acid storage line 42 parallel to each other. A flow rate of sulfuric acid at the second sulfuric acid storage line 42 is lower than a flow rate of sulfuric acid at the first sulfuric acid storage line 41. Thus, if sulfuric acid is supplied (stored) to the sulfuric acid weighing tank 30 through the first sulfuric acid storage line 41 and the second sulfuric acid storage line 42 at the first sulfuric acid storage flow rate, it is possible to shorten a supplying time of the sulfuric acid. If sulfuric acid is supplied to the sulfuric acid weighing tank 30 through the second sulfuric acid storage line 42 at the second sulfuric acid storage flow rate, it is possible to reduce a supply rate of the sulfuric acid to the sulfuric acid weighing tank 30. In this case, accuracy of timing of stopping the supply of sulfuric acid can be improved, and, thus, accuracy of a storage amount (weighed amount) of sulfuric acid to be supplied to the sulfuric acid weighing tank 30. In particular, in accordance with the present illustrative embodiment, sulfuric acid is supplied from the sulfuric acid supply source 40 to the sulfuric acid weighing tank 30 by using the third sulfuric acid liquid surface level sensor 30c and the fourth sulfuric acid liquid surface level sensor 30d. Thus, it is possible to further improve accuracy of a storage amount (weighed amount) of sulfuric acid to be supplied to the sulfuric acid weighing tank 30.

Moreover, in accordance with the present illustrative embodiment, when sulfuric acid is supplied to the sulfuric acid weighing tank 30 from the sulfuric acid supply source at the second sulfuric acid storage flow rate, after a storage amount of the sulfuric acid within the sulfuric acid weighing tank 30 reaches the fourth sulfuric acid storage amount, the supply of the sulfuric acid from the sulfuric acid supply source 40 to the sulfuric acid weighing tank 30 is stopped. Then, the supply of the sulfuric acid from the sulfuric acid weighing tank 30 to the mixing tanks 11 and 12 is started. That is, the sulfuric acid within the sulfuric acid weighing tank 30 is stored in the fourth sulfuric acid storage amount right before the supply of the sulfuric acid to the mixing tanks 11 and 12 is started. Thus, even if a liquid surface is lowered due to volatilization within the sulfuric acid weighing tank 30 and the fourth sulfuric acid liquid surface level sensor 30d cannot detect such a lowering of the liquid surface, the supply of the sulfuric acid to the mixing tanks 11 and 12 can be started after the sulfuric acid is stored in the fourth sulfuric acid storage amount. Therefore, it is possible to prevent a decrease in a supply amount of sulfuric acid to the mixing tanks 11 and 12, and, thus, it is possible to further improve accuracy of a supply amount of sulfuric acid to be supplied to the mixing tanks 11 and 12.

Further, in accordance with the present illustrative embodiment, each of the mixing tanks 11 and 12 is connected to the concentration measurement unit 132. Thus, the concentration of the chemical liquid within the mixing tanks 11 and 12 can be measured. Further, based on the measured concentration of the chemical liquid, pure water, sulfuric acid, hydrogen peroxide solution, and hydrofluoric acid may be supplied to the mixing tanks 11 and 12 in supplement amounts required for reaching the target concentration as necessary. Therefore, it is possible to further improve accuracy of the concentration of the chemical liquid within the mixing tanks 11 and 12.

The liquid processing apparatus and the liquid processing method in accordance with the present illustrative embodiment are not limited to the above-described aspects and various changes and modifications can be made.

Furthermore, in accordance with the present illustrative embodiment, there has been explained a case where the pure water supply source 20 serves as a pure water supply unit. However, the present disclosure is not limited thereto. The pure water supply unit is configured as a pure water weighing tank (not illustrated) and the pure water weighing tank may be connected to the pure water supply source 20 in the same manner as the system for sulfuric acid. In this case, it is possible to further improve accuracy of a supply amount of the pure water to be supplied to the mixing tanks 11 and 12.

Moreover, in accordance with the present illustrative embodiment, there has been explained a case where when pure water is supplied to the mixing tanks 11 and 12, the pure water is firstly supplied at the first pure water supply flow rate and then, after adjusting the flow rate with the first pure water flow rate control opening/closing valve 26, the pure water is supplied at the second pure water supply flow rate lower than the first pure water supply flow rate. However, the present disclosure is not limited thereto. Pure water may be supplied through the first pure water supply line 21, and then, the pure water is supplied through the second pure water supply line 22 at a flow rate lower than a flow rate of the pure water at the first pure water supply line 21.

Further, in accordance with the present illustrative embodiment, there has been explained a case where the sulfuric acid weighing tank 30 serves as a sulfuric acid supply unit. However, the present disclosure is not limited thereto. If it is possible to surely obtain accuracy of a supply amount of the sulfuric acid to the mixing tanks 11 and 12, the sulfuric acid supply unit may be configured as the sulfuric acid supply source 40 in the same manner as the system for the pure water. Even in this case, the supply of the sulfuric acid to the mixing tanks 11 and 12 is started after an operation of the circulation pump 101 is started, and, thus, it is possible to shorten a cooling time of a chemical liquid. The same may be applied to hydrogen peroxide solution and hydrofluoric acid.

Furthermore, in accordance with the present illustrative embodiment, there has been explained a case where the first hydrogen peroxide solution supply opening/closing valve 54 serves as a flow rate control valve. However, the present disclosure is not limited thereto. In the same manner as the first sulfuric acid supply flow rate control valve 35, a hydrogen peroxide solution flow rate control valve may be provided at an upstream side of the branch portion 51a of the first hydrogen peroxide solution supply line 51. In this case, the first hydrogen peroxide solution supply opening/closing valve 54 may not serve as the flow rate control valve. The same may be applied to the first hydrofluoric acid supply opening/closing valves 74.

Moreover, in accordance with the present illustrative embodiment, there has been explained a case where a mixed chemical liquid is produced by mixing sulfuric acid and pure water. However, the present disclosure is not limited thereto. The present disclosure may be applied to a certain mixed liquid of which a temperature becomes higher than a service temperature due to an exothermic reaction during mixing.

What is claimed is:

1. A liquid processing method performed in a liquid processing apparatus including a mixing tank that mixes pure water and sulfuric acid to produce a mixed chemical liquid; a pure water supply line connected to the mixing tank; a sulfuric acid supply line connected to the mixing tank; a liquid processing unit that is connected to the mixing tank and configured to perform a liquid process on a substrate with the mixed chemical liquid produced in the mixing tank; a circulation line having a circulation pump that returns the mixed chemical liquid discharged from the mixing tank back to the mixing tank, both ends of the circulation line being connected to the mixing tank, the liquid processing method comprising:

producing the mixed chemical liquid by mixing pure water and sulfuric acid in the mixing tank; and performing a liquid process on a substrate with the mixed chemical liquid in the liquid processing unit, wherein the producing of the mixed chemical liquid comprises: starting supply of the pure water to the mixing tank; starting operation of the circulation pump after starting the supply of the pure water to the mixing tank; starting supply of the sulfuric acid to the mixing tank after starting the operation of the circulation pump, and supplying the mixed chemical liquid produced in the mixing tank to the substrate, the liquid processing apparatus further includes a temperature controller configured to heat or cool the mixed chemical liquid flowing through the circulation line; and a cooling unit configured to cool the mixed chemical liquid, and the producing of the mixed chemical liquid further comprises: cooling the mixed chemical liquid by the temperature controller and the cooling unit; and cooling or heating the mixed chemical liquid bypassing the cooling unit by the temperature controller after cooling the mixed chemical liquid by the temperature controller and the cooling unit.

2. The liquid processing method of claim 1,
wherein the cooling or heating of the mixed chemical liquid by the temperature controller is performed after a temperature of the mixed chemical liquid reaches a predetermined temperature in the cooling of the mixed chemical liquid by the temperature controller and the cooling unit.

3. The liquid processing method of claim 1,
wherein in the producing of the mixed chemical liquid, hydrogen peroxide solution is supplied to the mixing tank.

4. The liquid processing method of claim 1,
wherein in the producing of the mixed chemical liquid, hydrofluoric acid is supplied to the mixing tank.

5. The liquid processing method of claim 1,
wherein in the producing of the mixed chemical liquid, a concentration of the mixed chemical liquid is measured.

6. A liquid processing method performed in a liquid processing apparatus including a mixing tank that mixes pure water and sulfuric acid to produce a mixed chemical liquid; a pure water supply line connected to the mixing tank; a sulfuric acid supply line connected to the mixing tank; a liquid processing unit that is connected to the mixing tank and configured to perform a liquid process on a substrate with the mixed chemical liquid produced in the mixing tank; a circulation line having a circulation pump that returns the mixed chemical liquid discharged from the mixing tank back to the mixing tank, both ends of the circulation line being connected to the mixing tank, the liquid processing method comprising:
producing the mixed chemical liquid by mixing pure water and sulfuric acid in the mixing tank; and
performing a liquid process on a substrate with the mixed chemical liquid in the liquid processing unit,
wherein the producing of the mixed chemical liquid comprises: starting supply of the pure water to the mixing tank; starting operation of the circulation pump after starting the supply of the pure water to the mixing tank; starting supply of the sulfuric acid to the mixing tank after starting the operation of the circulation pump, and supplying the mixed chemical liquid produced in the mixing tank to the substrate, and in the producing of the mixed chemical liquid, the sulfuric acid is supplied to the mixing tank at a first sulfuric acid supply flow rate when the sulfuric acid is supplied to the mixing tank from a sulfuric acid storage tank, and then, when it is determined that a storage amount of the sulfuric acid within the sulfuric acid storage tank is smaller than a first preset amount, the sulfuric acid is supplied to the mixing tank at a second sulfuric acid supply flow rate lower than the first sulfuric acid supply flow rate.

7. The liquid processing method of claim 6, wherein in the producing of the mixed chemical liquid, the sulfuric acid is supplied to the sulfuric acid storage tank at a first sulfuric acid storage flow rate when the sulfuric acid is supplied to the sulfuric acid storage tank from a sulfuric acid supply source, and then, when it is determined that a storage amount of the sulfuric acid within the sulfuric acid storage tank reaches a second preset amount greater than the first preset amount, the sulfuric acid is supplied to the sulfuric acid storage tank at a second sulfuric acid storage flow rate lower than the first sulfuric acid storage flow rate.

8. The liquid processing method of claim 7, wherein in the producing of the mixed chemical liquid, while the sulfuric acid is supplied to the sulfuric acid storage tank from the sulfuric acid supply source at the second sulfuric acid storage flow rate, when it is determined that a storage amount of the sulfuric acid within the sulfuric acid storage tank reaches a third preset amount greater than the second preset amount, the supply of the sulfuric acid from the sulfuric acid supply source to the sulfuric acid storage tank is stopped, and then, supply of the sulfuric acid from the sulfuric acid storage tank to the mixing tank is started.

* * * * *

UNITED STATES PATENT AND TRADEMARK OFFICE
CERTIFICATE OF CORRECTION

PATENT NO.       : 9,452,397 B2  
APPLICATION NO.  : 13/772550  
DATED            : September 27, 2016  
INVENTOR(S)      : Hiroshi Komiya et al.

Page 1 of 1

It is certified that error appears in the above-identified patent and that said Letters Patent is hereby corrected as shown below:

In the Specification

Column 5, Line 65, insert -- 30 -- after the word "tank".

Column 6, Line 29, insert -- 35 -- after the word "valve".

Column 8, Line 65, insert -- 30 -- after the word "tank".

Signed and Sealed this  
Seventeenth Day of January, 2017

Michelle K. Lee  
*Director of the United States Patent and Trademark Office*